(12) United States Patent
Kuratomi et al.

(10) Patent No.: US 7,144,755 B2
(45) Date of Patent: Dec. 5, 2006

(54) FABRICATION METHOD OF SEMICONDUCTOR INTEGRATED CIRCUIT DEVICE

(75) Inventors: Bunshi Kuratomi, Kodaira (JP); Fukumi Shimizu, Tachikawa (JP); Kenichi Imura, Higashiyamato (JP); Katsushige Namiki, Ome (JP); Fumio Murakami, Kodaira (JP)

(73) Assignees: Renesas Technology Corp., Tokyo (JP); Eastern Japan Semiconductor Technologies, Inc., Tokyo (JP)

( * ) Notice: Subject to any disclaimer, the term of this patent is extended or adjusted under 35 U.S.C. 154(b) by 0 days.

(21) Appl. No.: 10/921,156

(22) Filed: Aug. 19, 2004

(65) Prior Publication Data

US 2005/0019979 A1    Jan. 27, 2005

Related U.S. Application Data

(63) Continuation of application No. 10/364,503, filed on Feb. 12, 2003, now Pat. No. 6,797,542.

(30) Foreign Application Priority Data

Feb. 14, 2002    (JP)    ............................ 2002-037204

(51) Int. Cl.
H01L 21/44    (2006.01)
(52) U.S. Cl. .................. 438/106; 438/107; 438/123
(58) Field of Classification Search ................ 438/106, 438/107, 123, 124, 112
See application file for complete search history.

(56) References Cited

U.S. PATENT DOCUMENTS

| | | | |
|---|---|---|---|
| 4,126,292 A | 11/1978 | Saeki et al. | |
| 5,071,334 A | 12/1991 | Obara | |
| 5,624,691 A | 4/1997 | Bednarz et al. | |
| 6,350,631 B1 * | 2/2002 | Kobayashi et al. | 438/107 |
| 6,469,370 B1 | 10/2002 | Kawahara et al. | |
| 6,716,553 B1 | 4/2004 | Fujita et al. | |
| 6,797,542 B1 * | 9/2004 | Kuratomi et al. | 438/112 |
| 6,975,022 B1 | 12/2005 | Sakamoto et al. | |
| 6,995,038 B1 * | 2/2006 | Egawa et al. | 438/106 |
| 2002/0019072 A1 * | 2/2002 | Kobayashi et al. | 438/107 |
| 2002/0115237 A1 | 8/2002 | Williams | |
| 2003/0153130 A1 * | 8/2003 | Kuratomi et al. | 438/123 |
| 2005/0019979 A1 * | 1/2005 | Kuratomi et al. | 438/106 |
| 2005/0070047 A1 * | 3/2005 | Kuratomi et al. | 438/107 |
| 2005/0133895 A1 * | 6/2005 | Ujiie et al. | 257/678 |

FOREIGN PATENT DOCUMENTS

| | | |
|---|---|---|
| JP | 05-50456 | 3/1993 |
| JP | 07-164473 | 6/1995 |
| JP | 11-297731 | 10/1999 |
| JP | 11297731 A * | 10/1999 |
| JP | 2000-12598 | 1/2000 |

(Continued)

*Primary Examiner*—Laura M. Schillinger
(74) *Attorney, Agent, or Firm*—Antonelli, Terry, Stout and Kraus, LLP.

(57) ABSTRACT

At the time of performing resin molding for a matrix frame in the fabrication of semiconductor integrated circuit devices, a predetermined amount of air is fed into each of first cavities in a first row and second cavities in a second row, the first and second cavities being formed in a matrix arrangement in a lower mold of a molding die, so as to pressurize the interiors of the cavities, and a sealing resin is charged into the cavities, while the pressure therein is regulated in such a manner that the charging speeds of the sealing resin become equal in all of the cavities, whereby it is possible to stabilize the quality of the product being obtained.

6 Claims, 21 Drawing Sheets

FOREIGN PATENT DOCUMENTS

| | | |
|---|---|---|
| JP | 2000-68305 | 3/2000 |
| JP | 2000-164615 A | 6/2000 |
| JP | 2000-243876 | 9/2000 |
| JP | 2001-332649 | 11/2001 |
| WO | WO 00/68305 | 11/2000 |

* cited by examiner

FABRICATION METHOD OF SEMICONDUCTOR INTEGRATED CIRCUIT DEVICE

This application is a Continuation application of application Ser. No. 10/364,503, filed Feb. 12, 2003, now U.S. Pat. No. 6,797,542 the contents of which are incorporated herein by reference in their entirety.

BACKGROUND OF THE INVENTION

The present invention relates to a technique for use in fabricating a semiconductor integrated circuit device, and, more particularly, to a technique which is effective when applied to resin molding in an assembly using a matrix frame.

Resin molding techniques are described, for example, in Japanese Unexamined Patent Publication Nos. 2000-68305, Hei 11(1999)-297731, and 2000-164615.

Unexamined Patent Publication No. 2000-68305 discloses a technique in which the interior of a cavity is pressure-reduced prior to injection of resin into the cavity then, the cavity is pressurized almost simultaneously with the entry of the resin into the cavity and, thereafter, is pressure-reduced.

Unexamined Patent Publication No. Hei 11(1999)-297731, discloses a technique in which resin is charged into a cavity while pressurizing the interior of the cavity through air vents.

Unexamined Patent Publication No. 2000-164615, discloses a technique in which an air bleeder is formed in a press and cut relief plane of a resin sealing die, and residual air in a cavity and gas issuing from the molten resin are discharged to the exterior through the air bleeder.

SUMMARY OF THE INVENTION

If resin molding is performed in an assembly using a matrix frame, the charging speed of sealing resin differs between a first row of cavities located close to the pots of a molding die and a second row of cavities more widely spaced therefrom, the cavities being arranged in a matrix form, thus giving rise to the problem that the quality of the resulting product is deteriorated. That is, since the distance of the second row of cavities from the pots is longer than that of the first row of cavities, the resin charging speed for the second row of cavities is lower than that for the first row of cavities, thus leading to the deterioration of the quality of the produced product.

It is an object of the present invention to provide a method of fabricating a semiconductor integrated circuit device, which method can attain stabilization of the product quality.

It is another object of the present invention to provide a method of fabricating a semiconductor integrated circuit device, which method provides for an improvement in the freedom in developing a resin material of a sealing resin.

It is a further object of the present invention to provide a method of fabricating a semiconductor integrated circuit device, which method provides an improvement in the freedom of assembling conditions.

It is a still further object of the present invention to provide a method of fabricating a semiconductor integrated circuit device, which method can attain a reduction in the manufacturing cost.

The above and other objects and novel features of the present invention will become apparent from the following description and the accompanying drawings.

As to typical examples of in the present invention, a brief description will be given below.

In accordance with the present invention, the interiors of cavities arranged in a matrix form are pressurized and charged with a sealing resin in such a manner that the resin is charged at the same speed for all of the cavities.

Other more specific examples of the present invention will be described below:

1. A method of fabricating a semiconductor integrated circuit device, comprises the steps of:
   (a) providing a lead frame on which plural device forming regions are arranged in a matrix form, the device forming regions each having a chip mounting portion and plural leads;
   (b) mounting semiconductor chips, respectively, onto the chip mounting portions of the lead frame;
   (c) disposing the lead frame with the semiconductor chips mounted thereon on a mold surface of a molding die, which mold surface includes cavities, and thereafter closing the molding die;
   (d) pressurizing the interiors of the matrix cavities at a pressure in the range from 1 to 10 kg/cm$^2$ and charging a sealing resin into the thus-pressurized cavities; and
   (e) after the step (d), dividing the lead frame into individual device forming regions.

2. A method of fabricating a semiconductor integrated circuit device, comprises the steps of:
   (a) providing a multi-chip substrate on which plural device forming regions are arranged in a matrix form, the device forming regions each having a chip mounting region and plural leads;
   (b) mounting semiconductor chips, respectively, onto the chip mounting regions of the multi-chip substrate, the semiconductor chips each having a thickness of 220 μm or less;
   (c) disposing the multi-chip substrate with the semiconductor chips mounted thereon on a mold surface of a molding die, which mold surface includes a single cavity, and thereafter closing the molding die, while allowing the single cavity to cover all of the plural device forming regions;
   (d) pressurizing the interior of the cavity, and charging a sealing resin into the thus-pressurized cavity; and
   (e) after the step (d), dividing the multi-chip substrate into individual device forming regions.

DETAILED DESCRIPTION OF THE PREFERRED EMBODIMENTS

Figure 1:
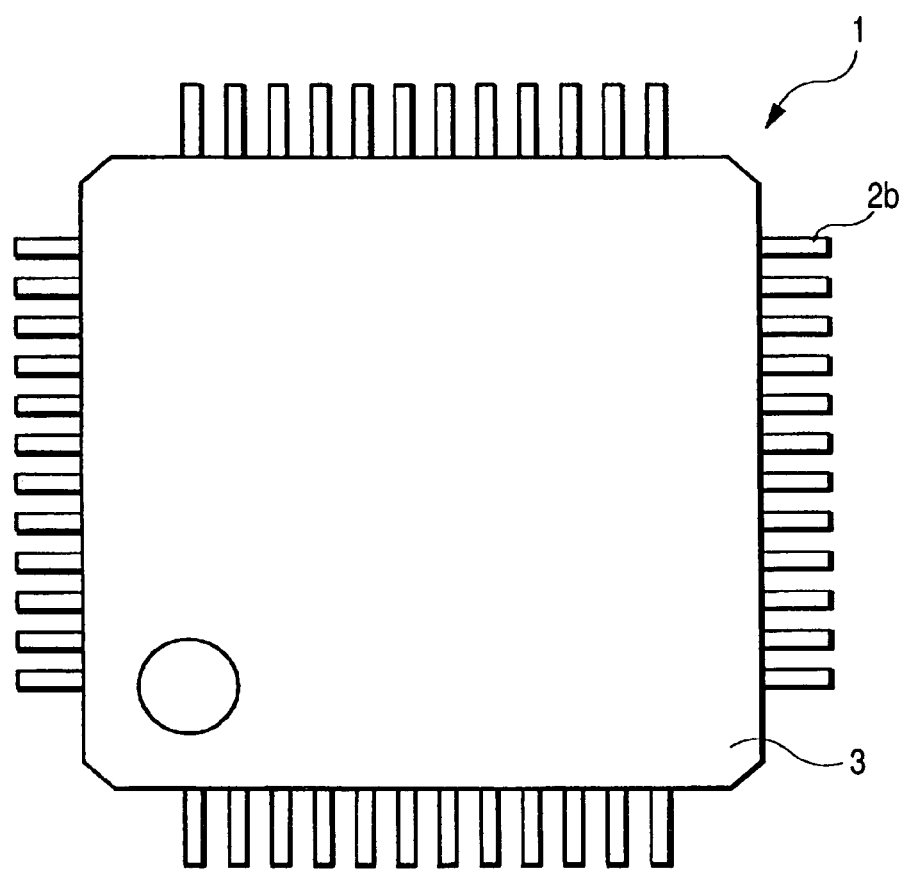
FIG. 1 is a plan view showing a structural example of a semiconductor integrated circuit device, which is assembled by a semiconductor integrated circuit device fabricating method according to a first embodiment of the present invention.

Various embodiments of the present invention will be described in detail hereinunder with reference to the accompanying drawings.

In the following description of the embodiments, if necessary for convenience' sake, a description of the subject matter will be given in a divided manner in plural sections or embodiments, but unless otherwise mentioned, they are not unrelated to each other, but are in a relation such that one is a modification, represents details, or is a supplementary explanation, of a part or the whole of the other.

In the following description of the embodiments, when reference is made, for example, to a number of elements (including the number, numerical values, quantities, and ranges), it is to be understood that no limitation is placed on the specific number referred to, but that numbers above and below the specific number are also employable, unless otherwise specified, and except for the case where a limitation is placed on a specific number basically obviously.

In the following description of the embodiments, it goes without saying that the constituent elements thereof (including element steps) are not always essential unless otherwise specified, and except for the case where they are considered essential basically obviously.

In the following description of the embodiments, when reference is made, for example, to the shapes and positional relations of constituent elements or the like, it is to be understood that those substantially similar or closely similar to the said shapes, etc. are also included, unless otherwise specified, and except for the case where they are not so considered basically obviously.

In all of the drawings, components having the same functions are identified by like reference numerals and repeated explanations thereof will be omitted.

(First Embodiment)

A first embodiment of the present invention will be described with reference to FIGS. 1–17 of the accompanying drawings.

Figure 2:
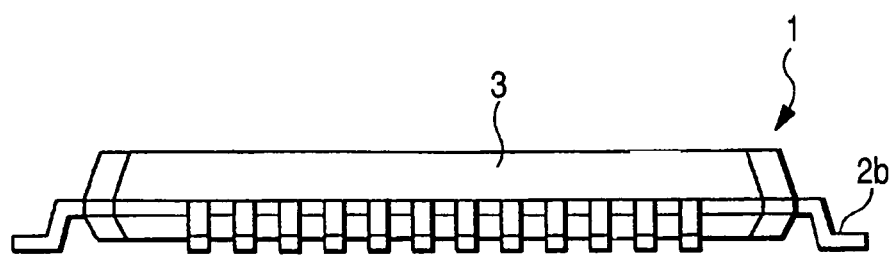
FIG. 2 is a side view of the device of FIG. 1.
Figure 3:
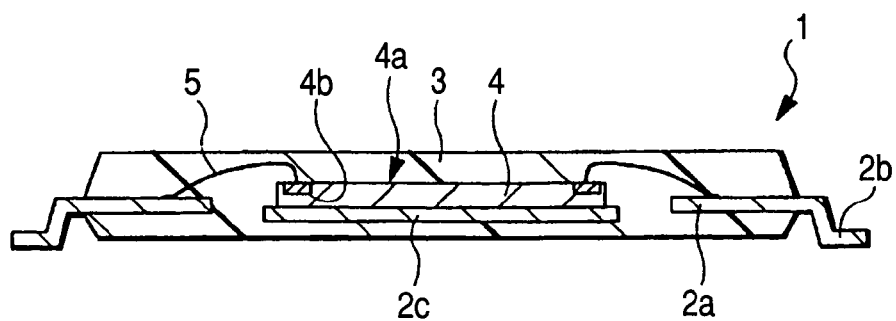
FIG. 3 is a sectional view of the device of FIG. 1.

The semiconductor integrated circuit device fabricating method of this first embodiment is a method for assembling a thin QFP (Quad Flat Package) 1, such as shown in FIGS. 1, 2, and 3.

The QFP 1 is made up of a semiconductor chip 4 having a semiconductor integrated circuit; plural inner leads (leads) 2a arranged radially around the semiconductor chip 4; plural wires (fine wires) 5, such as gold wires, for connection between bonding electrodes 4b, which serve as surface electrodes formed on a main surface 4a of the semiconductor chip 4, and the inner leads 2a corresponding thereto; a tab (chip mounting portion) 2c to which the semiconductor chip 4 is fixed through a die bonding material; a seal member 3 formed by resin molding to seal both the semiconductor chip 4 and the plural wires 5; and plural outer leads 2b formed integrally with the inner leads 2a and projecting outwards from the seal member 3.

The QFP 1 of this first embodiment is a thin type package in which the thickness of the seal member 3 is, for example, 1.2 mm or less. For example, the wires 5 comprise gold wires of 30 μm or less in diameter, and the plural bonding electrodes 4b formed on the main surface 4a of the semiconductor chip 4 are arranged at a pitch of 65 μm or less, for example. According to this construction it is possible to attain a QFP 1 having a multi-pin structure. That is, by thinning the wire diameter and narrowing the pad pitch, it is possible to attain a QFP 1 having a multi-chip structure or to achieve chip-shrinkage of the QFP 1.

As to the thickness, wire diameter and pad pitch in the QFP 1, no limitation is placed on the above ranges, but even those various outside the above ranges are also employable. The inner leads 2a, outer leads 2b and tab 2c are formed using a thin plate of copper alloy or iron-nickel alloy, for example. The seal member 3 is formed by molding an epoxy resin, for example.

Figure 4:
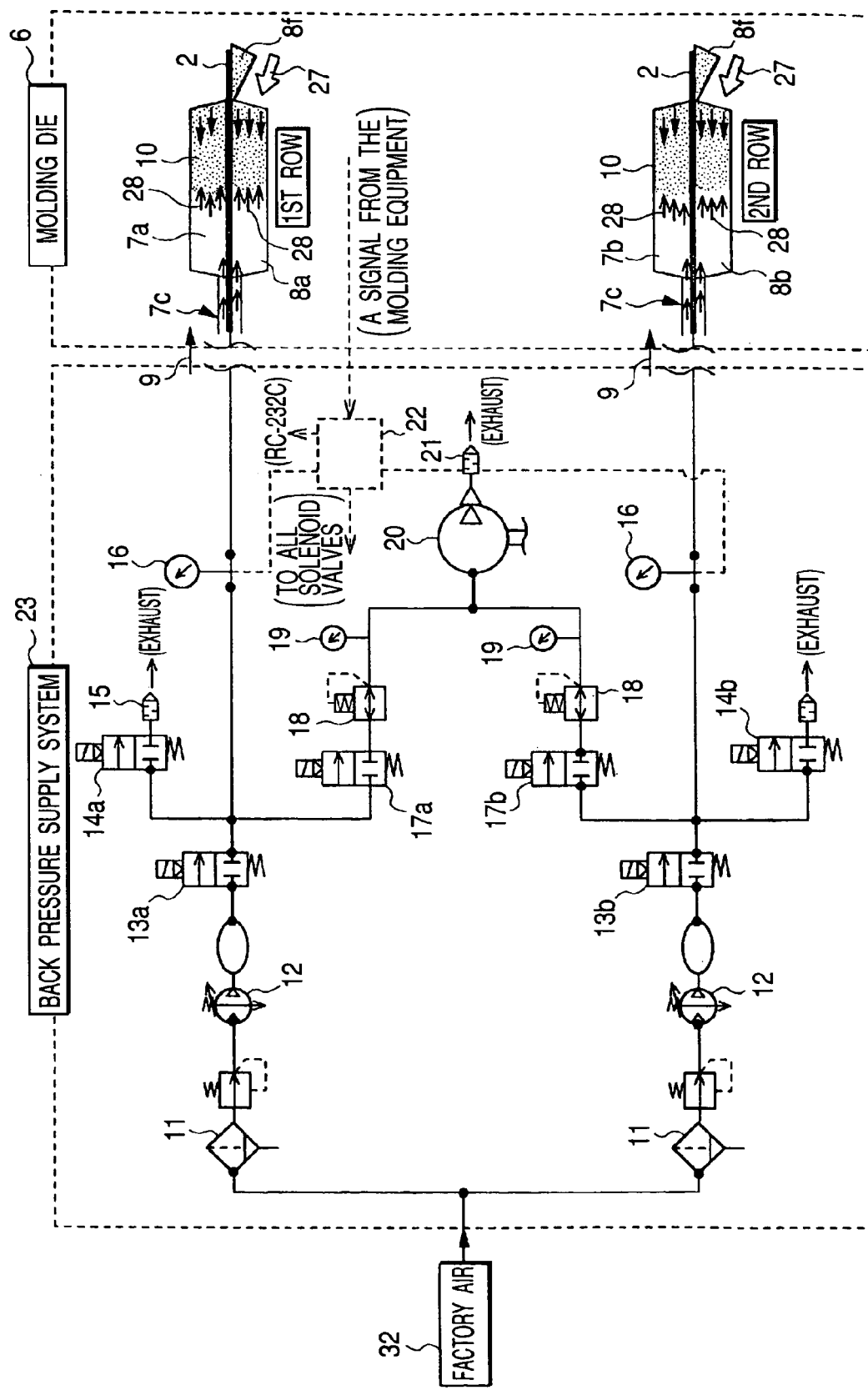
FIG. 4 is a constructional block diagram showing the structure of a back pressure supply system used in the semiconductor integrated circuit device fabricating method of the first embodiment, and also showing an example of a state of connection with a molding die.

Next, a description will be given concerning a back pressure supply system, as shown in FIG. 4, which is used in a resin sealing step in assembling the QFP 1 of this first embodiment.

The back pressure supply system, indicated at 23, is connected to a molding die 6 in molding equipment so as to apply or reduce the pressure within the cavities of the molding die 6 in a resin molding step.

In the back pressure supply system 23, mainly, there are provided regulators (mist separator combination) 11, pressure intensifying valves (air tank combination) 12, solenoid valves 13a and 13b, exhaust valves 14a and 14b for atmospheric pressure exhaust, exhaust valves 17a and 17b for vacuum exhaust, silencers 15 and 21, pressure gauges 16 and 19, vacuum regulators 18, a vacuum pump 20, and a sequencer 22.

Figure 5:
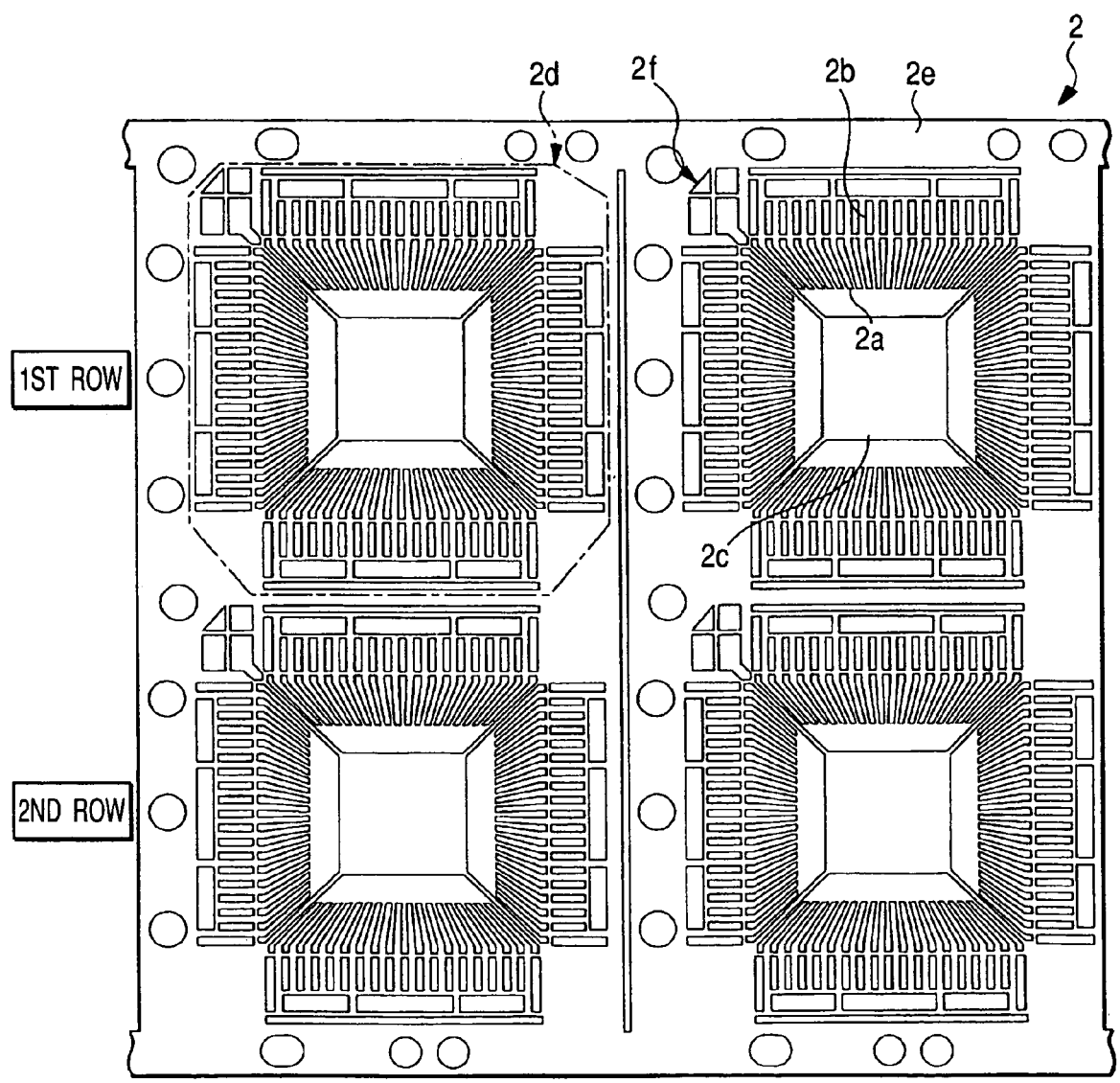
FIG. 5 is a partial plan view showing a structural example of a matrix frame as used in the semiconductor integrated circuit device fabricating method of the first embodiment.

In the molding die 6, first cavities 7a in a first row arranged on a side close to pots 8d (see FIG. 7) and second cavities 7b in a second row arranged on a side remote from the pots 8d have separate pressurizing/reducing systems corresponding to the matrix frame (lead frame) 2 shown in FIG. 5, so that each system operates independently in the first and second cavities 7a, 7b, thereby to make it is possible to individually control the amounts of pressurization and pressure reduction in the cavities of each row.

As shown in FIG. 4, using factory air 32 as an initial pressure, a predetermined amount of air 9 is fed from the back pressure supply system 23 to the first and second cavities 7a, 7b in the molding die 6 by means of the pressure intensifying valves 12 or the vacuum pump 20.

At this time, the amount of air 9 to be pressurized is set such that a back pressure 28 acting as a flow resistance to the sealing resin 10 becomes a preset value. The flow, i.e., charging speed, of the sealing resin 10 is controlled by adjusting the amount of air 9 to be pressurized so as to adjust the back pressure 28 against a resin injection pressure 27.

For example, the first row of cavities have a higher resin charging speed than the second row of cavities; and, therefore, the interior of each cavity is pressurized at a predetermined pressure (a pressure of a magnitude capable of delaying the charging speed of the sealing resin 10 in the first row of cavities) to delay the resin charging speed in the first row, so that the charging speed of the sealing resin 10 in a first row cavity and that in a second row cavity become almost equal to each other.

That is, in the first and second rows of cavities, in order to mitigate instability, uncontrollability, and oversensitivity to external factors, of the resin front caused by the injection of the sealing resin 10 in a strong dynamic imbalance state, a dynamic imbalance at the resin interface is weakened by increasing the back pressure to the sealing resin 10. The interiors of the first and second cavities 7a, 7b are pressurized so that the charging speed of the sealing resin 10 in the first row cavities and that in the second row cavities become equal to each other.

Therefore, if the preset back pressure 28 is applied into each cavity at the time of resin filling, the charging speed of the sealing resin 10 in the first cavities 7a of the first row, which charging speed is high in an unpressurized stage, becomes low and equal to the charging speed of the sealing resin 10 in the second cavities 7b of the second row, which charging speed is low in an unpressurized state.

The air supply systems for the first and second cavities 7a, 7b in the molding die 6 are independent, and so the back pressure 28 can be set independently for each of both systems. A back pressure 28 of a magnitude not larger than the initial pressure can also be set by the regulators 11. Further, it is possible to set the pressure from positive to negative by the selection of intensifying valves 12 and vacuum pump 20.

The solenoid valves 13a, 13b, exhaust valves 14a, 14b, and exhaust valves 17a, 17b each can be controlled independently by the sequencer 22. With signals received by the sequencer 22 from the molding equipment in which the molding die 6 is provided, it is possible to set the opening/closing timings of the solenoid valves 13a, 13b, exhaust valves 14a, 14b, and exhaust valves 17a, 17b in accordance with the operations of the molding equipment.

Further, data from the pressure gauges 16 can be monitored or analyzed using a personal computer or the like through the sequencer 22. The pressure gauges 16 may be replaced by pressure sensors buried in the cavities.

The following description is directed to a method of fabricating the semiconductor integrated circuit device (QFP 1) of this first embodiment.

First, the matrix frame 2 shown in FIG. 5 is provided. This matrix frame 2 has plural device regions (device forming regions) 2d each for forming one QFP 1, the device regions 2d being arranged in a matrix form of plural rows x plural columns. Each device region 2d has a tab (chip mounting portion) 2c, inner leads (leads) 2a, and outer leads (leads) 2b.

A gate resin sump portion 2f, corresponding to each gate 8f in the molding die 6, is formed at one corner portion of each device region 2d. For example, the matrix frame 2 is formed using a thin plate of copper alloy.

Thereafter, semiconductor chips 4 are mounted, respectively, onto the tabs 2c of the matrix frame 2 through a die bonding material. In this case, if the QFP 1 is to attain a multi-pin structure, it is preferable that bonding electrodes 4b on the main surface 4a of each semiconductor chip 4 be formed at a mounting pitch of 65 μm or less.

Subsequently, wire bonding is performed. More specifically, the bonding electrodes 4b on each semiconductor chip 4 and corresponding inner leads 2a are connected together through wires 5. In the case where the QFP 1 is to attain a multi-pin structure, it is preferable that gold wires having a diameter of 30 μm or less, for example, be used as the wires 5.

Thereafter, resin molding is performed. Here reference will first be made to the structure of the molding die 6 in the molding equipment for assembling the QFP 1.

Figure 6:
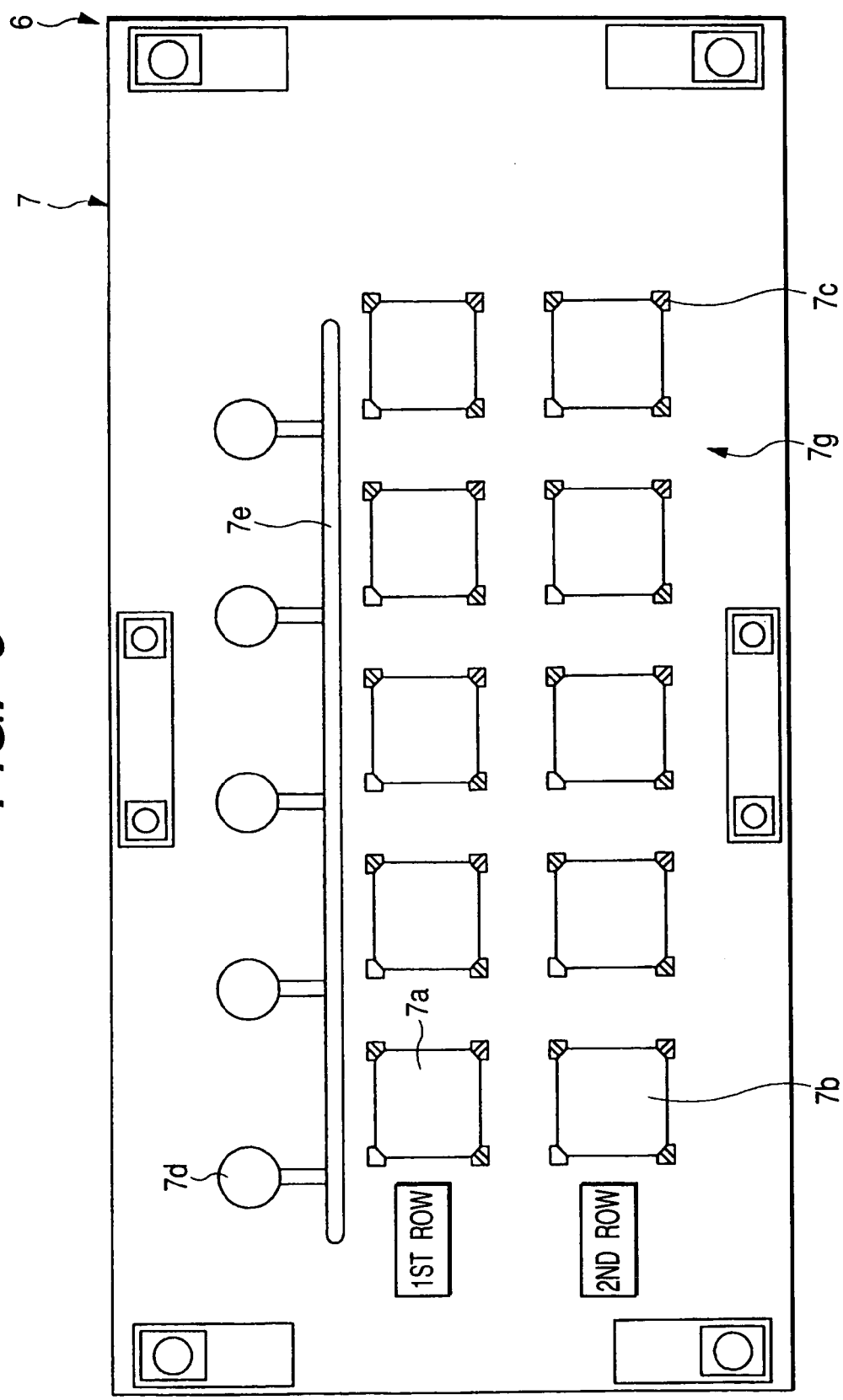
FIG. 6 is a plan view showing a structural example of an upper mold in a molding die used in the semiconductor integrated circuit device fabricating method of the first embodiment.

FIG. 6 shows the mold surface 7g of an upper mold 7 in the molding die 6. Five first cavities 7a are arranged as cavities in the first row, and, likewise, five second cavities 7b are arranged as cavities in the second row, all of the cavities being arranged in a matrix form corresponding to the matrix frame 2. There are culls 7d, corresponding to pots 8d of a lower mold 8 shown in FIG. 7, and a runner 7e serving as a resin flow path to the culls 7d. Further, in each of the first and second cavities 7a, 7b, air vents 7c are formed in three corners, but not in the corner corresponding to each gate 8f in the lower mold 8.

Figure 7:
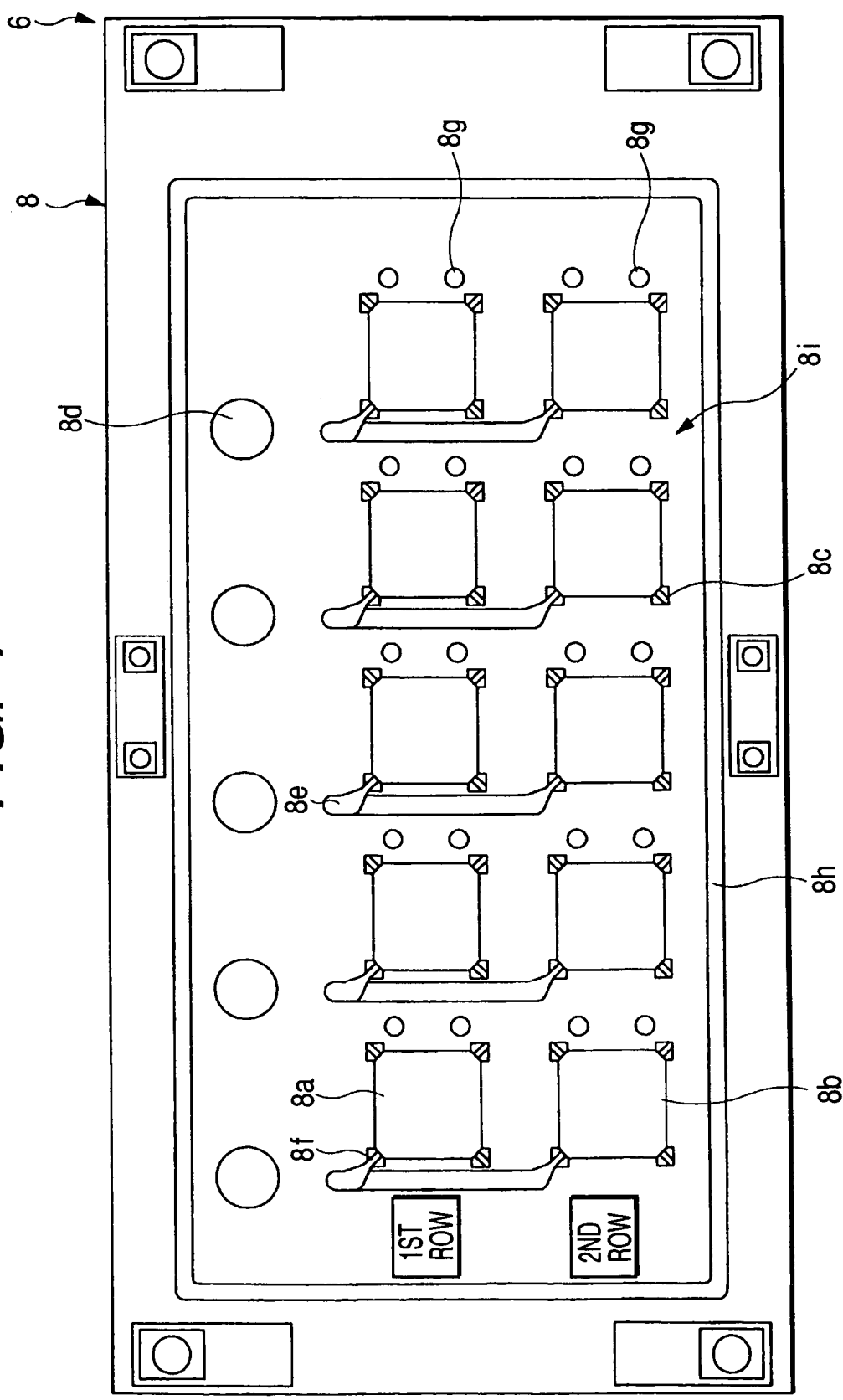
FIG. 7 is a plan view showing a structural example of a lower mold in the molding die used in the semiconductor integrated circuit device fabricating method of the first embodiment.

FIG. 7 shows the mold surface 8i of the lower mold 8 in the molding die 6. Five first cavities 8a are arranged as cavities in the first row, and, likewise, five second cavities 8b are arranged as cavities in the second row, all of the cavities being arranged in a matrix form as in the case of the upper mold 7. Further, there are pots 8d, sub-runners 8e and air vents 8c, as well as plural suction holes 8g for effecting the application and reduction of pressure. The suction holes 8g are arranged adjacent to the first and second cavities 8a, 8b in correspondence therewith. In the example of the lower mold 8, as shown in FIG. 7, two suction holes 8g are formed for each cavity.

For the application or reduction of pressure in each cavity, air 9 is fed from the suction holes 8g, or air is exhausted therefrom. In this first embodiment, therefore, the application or reduction of pressure in each cavity can be effected by performing, for each cavity, a supplying or exhausting of air 9 through the suction holes 8g.

A ring-like packing 8h is buried around the periphery of the region including the pots 8d, the cavities and the plural suction holes 8g, so that the molding region is hermetically closed upon closure of both the upper and lower molds 7, 8.

The application of pressure in each cavity is performed by the supply of air 9 through air vents 7c and 8c, which are in communication with the cavity, while the reduction of pressure in each cavity is performed by the exhausting of air 9 through the air vents 7c and 8c.

Figure 8:
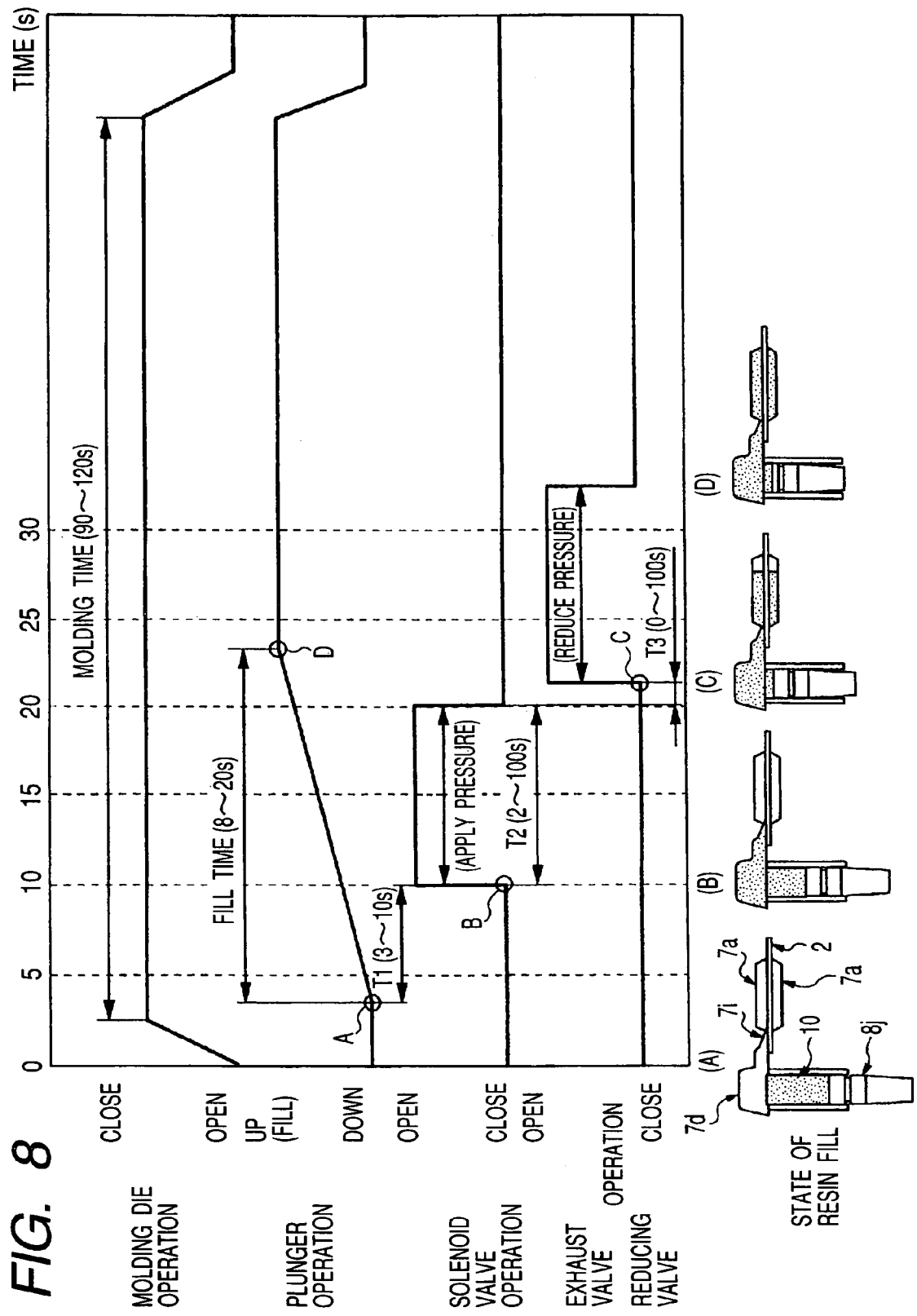
FIG. 8 is a timing chart showing an example of the timing of molding die operations and back pressure feed operations of the back pressure supply system in a molding step in the semiconductor integrated circuit device fabricating method of the first embodiment.

Within each pot 8d, there is disposed a plunger 8j, as shown in FIG. 8, for extruding the sealing resin 10 in a molten condition. Resin molding is carried out using the molding die 6 thus constructed.

Resin molding will now be described with reference to the time chart of FIG. 8. FIG. 8 shows an example of the preferred operation times and the operation time tolerances of the plungers 8j, solenoid valves 13a, 13b, and exhaust valves 14a, 14b, 17a, 17b.

First, the matrix frame 2, with semiconductor chips 4 mounted thereon, and which has gone through wire bonding, is disposed on the mold surface 8i of the lower mold 8 in the molding die 6; and, then, the upper and lower molds 7, 8 are closed, thereby to clamp the matrix frame, as indicated by the molding operations in FIG. 8.

Figure 9:
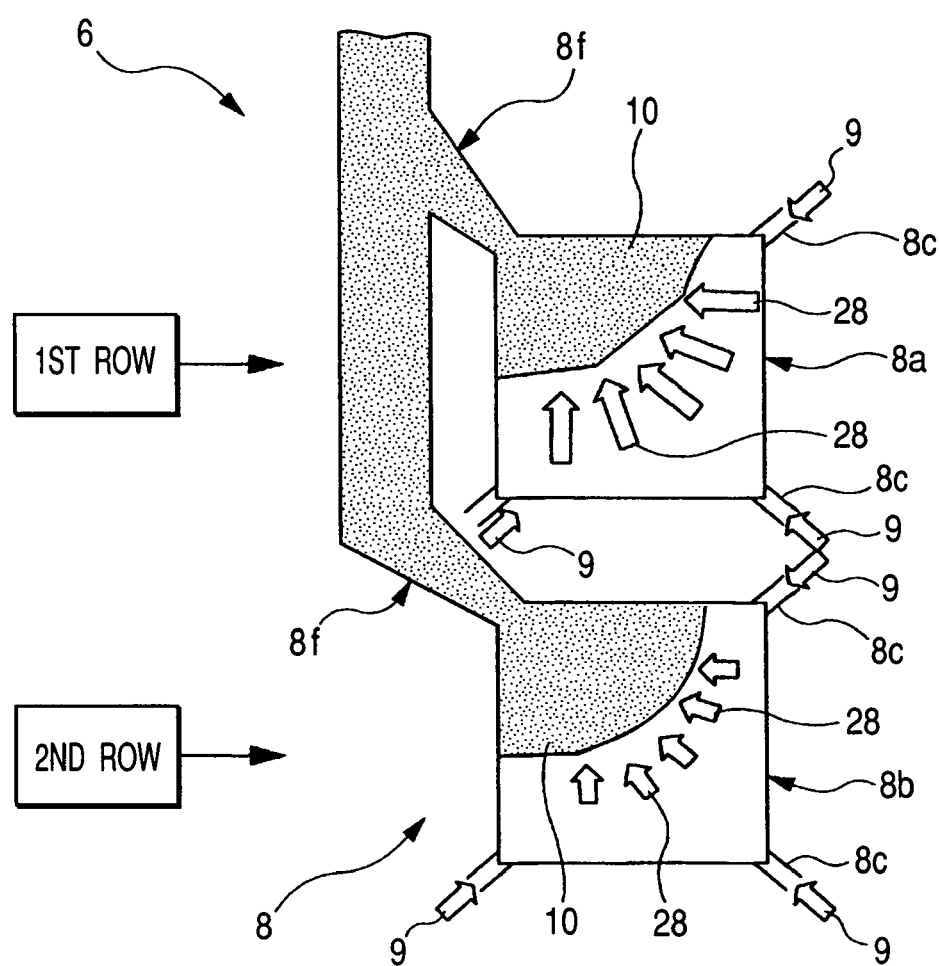
FIG. 9 is a diagrammatic plan view showing an example of a cavity pressurizing state in the molding step.
Figure 10:
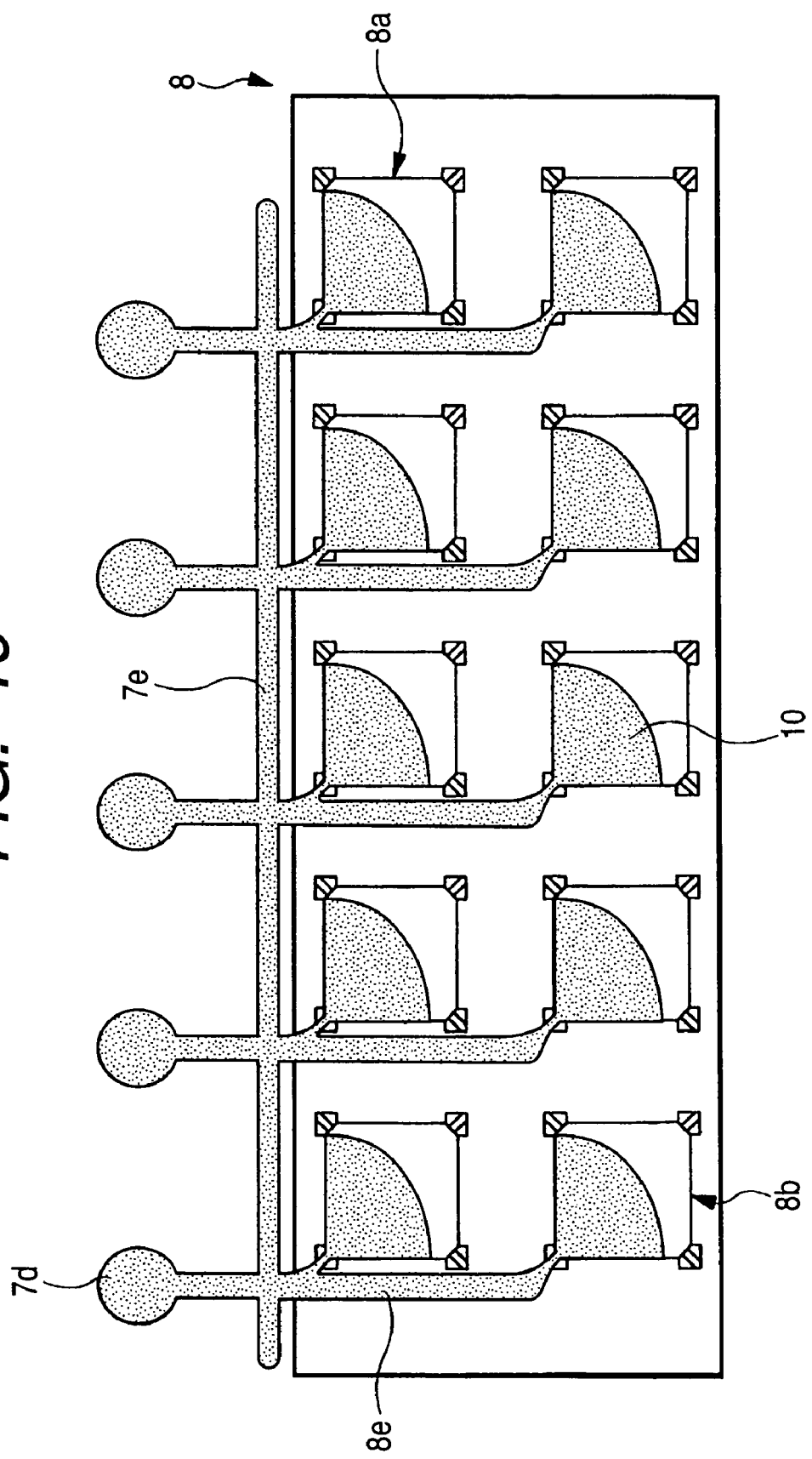
FIG. 10 is a diagrammatic plan view showing an example of a resin filled state of cavities in the molding step.

After making sure that the mold has been clamped, a plunger operation is started to inject the sealing resin 10 into each cavity. At this time, according to this first embodiment, as shown in FIG. 9, the interiors of the first and second cavities 8a, 8b in the first and second rows, respectively, in the matrix arrangement are pressurized at a predetermined pressure, and the sealing resin 10 is charged into the cavities so as to achieve the same charging speed in all of the cavities.

To be more specific, a predetermined amount of air 9 is fed into the first and second cavities from the air vents 7c through the suction holes 8g, thereby making the charging speed of sealing resin 10 equal in the first and second rows of cavities. The application of pressure into each cavity is performed by opening/closing operations of the solenoid valves 13a and 13b in accordance with the solenoid valve operation shown in FIG. 8.

First, as shown in FIG. 8, when a plunger 8j begins to move upward from below, the sealing resin 10 in a molten condition begins to be extruded. In this first embodiment, however, it is preferable that the interior of each cavity be held in a state in which it is at atmospheric pressure until the molten sealing resin 10 reaches the gates 8f in the molding die 6. By the state of atmospheric pressure, it is meant that the internal pressure of each cavity is made almost equal to the pressure present outside the molding die 6, i.e., a state free of a difference in pressure between the interior and the exterior. In other words, it means that the interior of each cavity is maintained in a state free of any intentional application or reduction of pressure. For example, this requirement is satisfied if the interior of each cavity is open to the atmosphere before the mold is clamped, and if neither the application nor reduction of pressure is performed until the sealing resin 10 reaches the gates 8f.

A pressure value indicating the state of atmospheric pressure is 1 Atm, for example, but the tolerance thereof is about 0.5 to 1.5 Atm.

By thus performing neither pressurization nor pressure reduction in each cavity until the arrival of the sealing resin 10 at the gates 8f, it is possible to prevent the inclusion of air in the sealing resin within culls 7d during the rising motion of the plungers 8j, whereby it is possible to prevent the formation of voids in the sealing resin 10 and the seal member 3.

To be more specific, if air 9 enters into a cull 7d under pressure at the operation start point of the associated plunger 8j ((A) in the state of resin fill in FIG. 8), then after operation of the plunger 8j, the sealing resin 10, which has entered the cull 7d, will have included therein air 9 at a high pressure, resulting in voids being formed within the sealing resin. At this time, the high-pressure air 9 is difficult to crush and is apt to remain. On the other hand, in the case of air 9 of atmospheric pressure or the like, it can be crushed in response to the resin injection pressure; and, therefore, it is preferable to avoid pressurization in each cavity until arrival of the sealing resin 10 at the associated gate 8f.

It is also preferable to avoid the reduction of pressure. This is because, if a reduction in the pressure occurs in the cavities after operation of the plungers 8j and before arrival of the sealing resin 10 at the gates 8f, the molten sealing resin is pulled toward the cavities within the culls 7d and air becomes included therein; and, the air 9 stays within the sealing resin 10, resulting in voids being formed. Thus, by preventing a reduction in the pressure before arrival of the sealing resin 10 at the gates 8f, it is possible to prevent the formation of voids in the sealing resin or in the seal member 3.

Next, a description will be given concerning the application of pressure in each cavity. The time taken from the start of movement of each plunger 8j until arrival thereof at an upper-limit position corresponds to the charging time of the sealing resin 10, which charging time is about 8 to 20 seconds. Within this charging time, the solenoid valves 13a and 13b are opened and closed in accordance with the solenoid valve operation to start and stop the pressurization in each cavity.

In this case, the application of pressure is started when (B) in the state of resin fill is assumed, as seen in FIG. 8. That is, the application of pressure is started substantially simultaneously with the start of entry of the molten sealing resin 10 into each cavity after arrival thereof at the associated gate 8f. As shown in FIG. 8, the time (T1) required from the plunger operation start point (A) up the pressurization start point (B) is about 3 to 10 seconds. Further, the time of operation (opening time) of the solenoid valves 13a and 13b, i.e., the pressurization time (T2) is about 2 to 100 seconds.

The above pressurization is carried out by the supply of air 9, intentionally, into the cavities through air vents 7c and 8c, which are formed in communication with the cavities. The magnitude of the pressurization is, for example, 5 kg/cm$^2$ in terms of a mid value, ranging from 1 to 10 kg/cm$^2$. The said numerical value indicates a pressure to be further added from the foregoing state of atmospheric pressure (for example, 1 Atm, tolerance: 0.5 to 1.5 Atm) in each cavity.

By thus setting the magnitude of pressurization in the range of 1 to 10 kg/cm$^2$, it is not necessary to install a high pressure tank in the back pressure supply system 23, and, hence, it is possible to avoid an increase in the size of the equipment. However, this pressurization magnitude range does not constitute any limitation, but an upper limit thereof may be larger than 10 kg/cm$^2$ in relation to the resin injection pressure.

In this way the charging of the sealing resin 10 is carried out under the supply of air 9 at a pressurization magnitude preferably in the range of 1 to 10 kg/cm$^2$, while establishing a setting such that the charging speeds of the sealing resin in the cavities become almost equal in all the cavities.

To be more specific, if the interior of each cavity is pressurized in the range of 1 to 10 kg/cm$^2$, the charging speeds of the sealing resin 10 in the first cavities 8a in the first row, which charging speeds are originally high, become low due to the back pressure 28 acting as a flow resistance, to the extent that there is scarcely any difference among the sealing resin charging speeds in the cavities. Consequently, it is possible to diminish variations in the state of resin fill among the cavities, and, hence, it is possible to stabilize the quality of the product, i.e., QFP 1.

Moreover, in selecting the sealing resin 10, it is possible to mitigate the limitation on its fluidity. More particularly, if there are different charging speeds among the cavities, a fluid sealing resin 10 is selected to match any of the cavities, thus resulting in a larger limitation in the selection of a sealing resin 10. In this first embodiment, however, it is possible to diminish variations in the state of resin fill among the cavities, so that, in the selection of sealing resin 10, it is possible to mitigate the limitation on its fluidity. As a result, it is possible to enhance the degree of freedom in the development of a sealing resin material.

Besides, since it is possible to mitigate the limitation on the fluidity of the sealing resin 10 in the selection of the same resin, it is no longer necessary to change the sealing resin according to the type of semiconductor integrated circuit device being produced, whereby the commonness of the sealing resin 10 can be enhanced.

Moreover, if there are different charging speeds among the cavities, the sealing resin 10 in cavities having a low charging speed becomes hard and is apt to cause wire deformation, and so it is necessary to establish molding conditions on the basis of cavities of low charging speeds. Thus, the assembling conditions are significantly limited. In this embodiment, however, since the commonness of the sealing resin 10 can be enhanced, it is possible to improve the freedom in establishing assembling conditions for the QFP 1.

Further, if the charging speeds of the sealing resin 10 are almost equal between the first and second cavities 8a, 8b, the angle of formation of gates 8f in the first cavities 8a and that in the second cavities 8b can be made equal to each other without direction, so that it is possible to attain a desired shape of the molding die 6 easily, whereby it is possible to reduce not only the cost of the molding die 6, but also the manufacturing cost of the QFP 1.

Further, since the molding die 6 can be formed into a desired shape easily, it is possible to shorten the period required for the development of the QFP 1.

Next, a description will be provided concerning the reduction of pressure in each cavity. As indicated at (C) in the state of resin fill, as seen in FIG. 8, the reduction of pressure is started after the stopping of pressurization in each cavity and before the completion of the charging of the sealing resin 10 into each cavity.

More specifically, the solenoid valves 13a and 13b are closed to stop the pressurization in each cavity and thereafter, before completion of the filling of sealing resin 10 into each cavity, the exhaust valves 14a and 14b, or the exhaust valves 17a and 17b, are opened to start the reduction of pressure.

The time (T3) taken from the stopping of pressurization until the start of pressure reduction is about 0 to 100 seconds. However, the stopping of pressurization and the start of pressure reduction may be substantially simultaneous.

Figure 11:
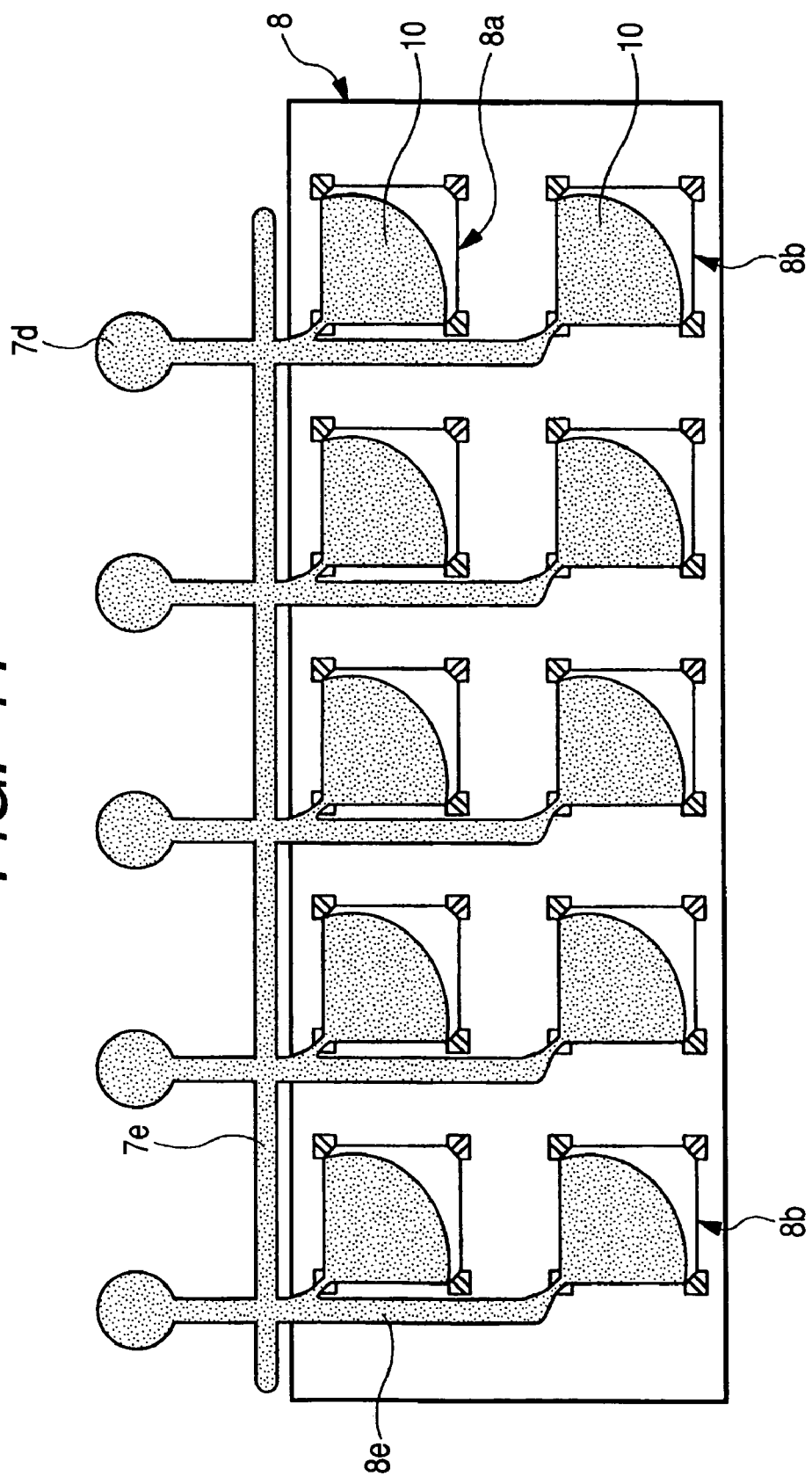
FIG. 11 is a diagrammatic plan view showing an example of a pressure reduction start timing (fastest) in the molding step.
Figure 12:
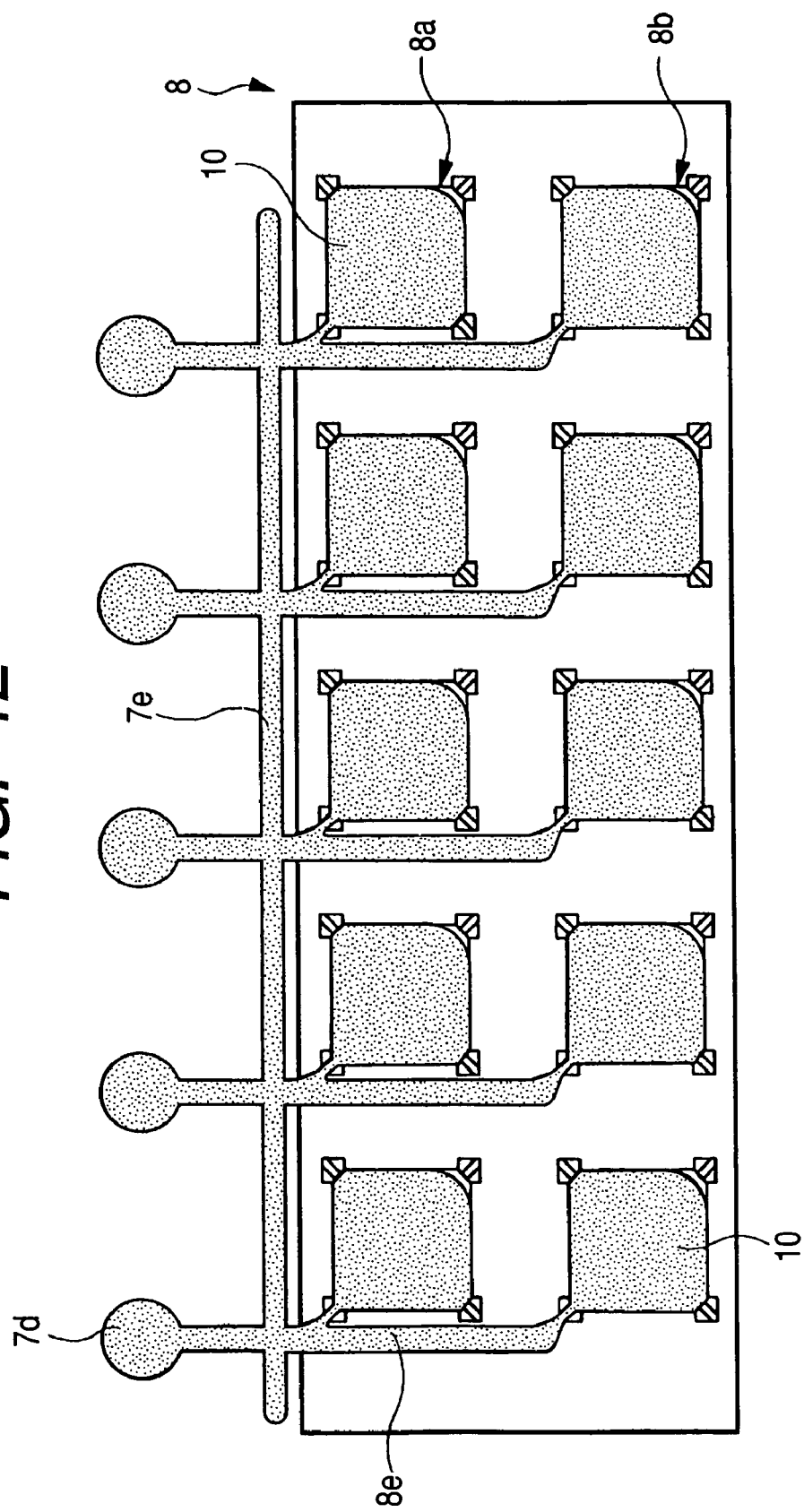
FIG. 12 is a diagrammatic plan view showing an example of a pressure reduction start timing (slowest) in the molding step.

In connection with pressure reduction start timings, a state of fill at the fastest timing and that at the slowest timing are shown in FIG. 11 (fastest timing) and FIG. 12 (slowest timing), respectively. As shown in FIG. 11, the fastest pressure reduction start timing corresponds to a time point at which the state of fill of the sealing resin 10 in each cavity has passed a half of the volume of the cavity. As shown in FIG. 12, the slowest pressure reduction start timing corresponds to a time point at which the filling of the sealing resin 10 in each cavity is about to end. Therefore, it is preferable that the reduction of pressure be started during the period from the time when the filling of the charging resin 10 in each cavity has passed a half of the cavity volume until just before completion of the filling.

By thus performing the pressure reduction, the air 9 which has entered each cavity with the application of pressure can be exhausted, and, hence, it is possible to prevent the air 9 from being included in the sealing resin 10. As a result, it is possible to prevent voids from being formed in the seal member 3 of QFP 1.

The reduction of pressure is stopped after the completion of resin filling, as shown at (D) in FIG. 8, and before opening the molding die 6. Resin molding is now over. Then, the molding die 6 is opened and the matrix frame 2 is taken out from the die.

Subsequently, the matrix frame 2 is cut, device region 2d by device region 2d, into individual device regions. In this case, a frame portion 2e of the matrix frame 2 and the outer leads 2b in each device region are cut off from each other, and the outer leads 2b are bent in a gull wing shape. Now, the assembly of QFP 1 is over.

In this way, it is possible to assemble the QFP 1 having a thickness of the seal member 3 of not larger than 1.2 mm. Thus, the resin molding method of this first embodiment is effective in assembling a thin semiconductor package, such as a QFP 1, having a thickness of the seal member 3 of not larger than 1.2 mm.

Figure 14:
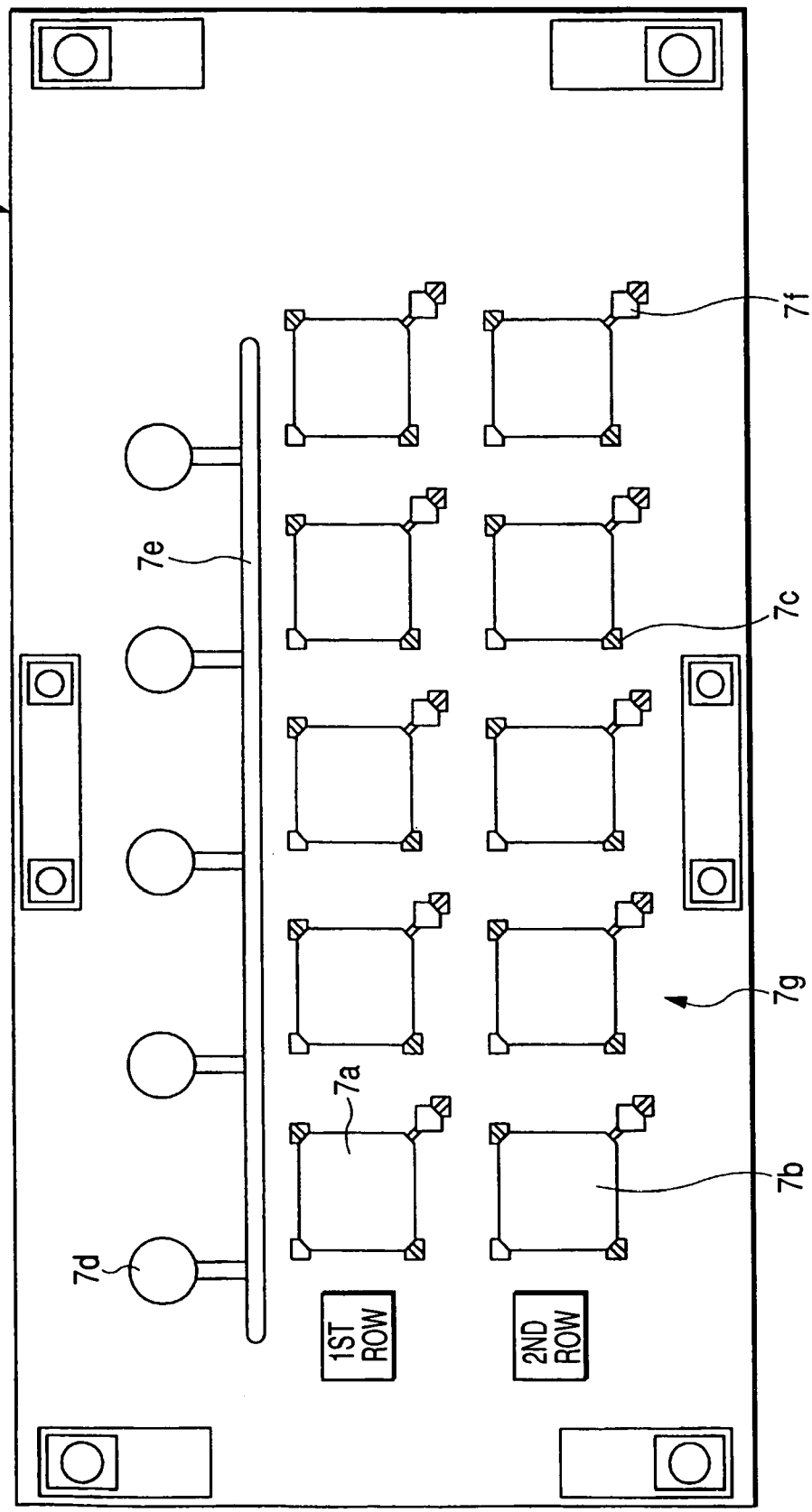
FIG. 14 is a diagrammatic plan view showing the structure of an upper mold according to a modification of the molding die used in the first embodiment.
Figure 15:
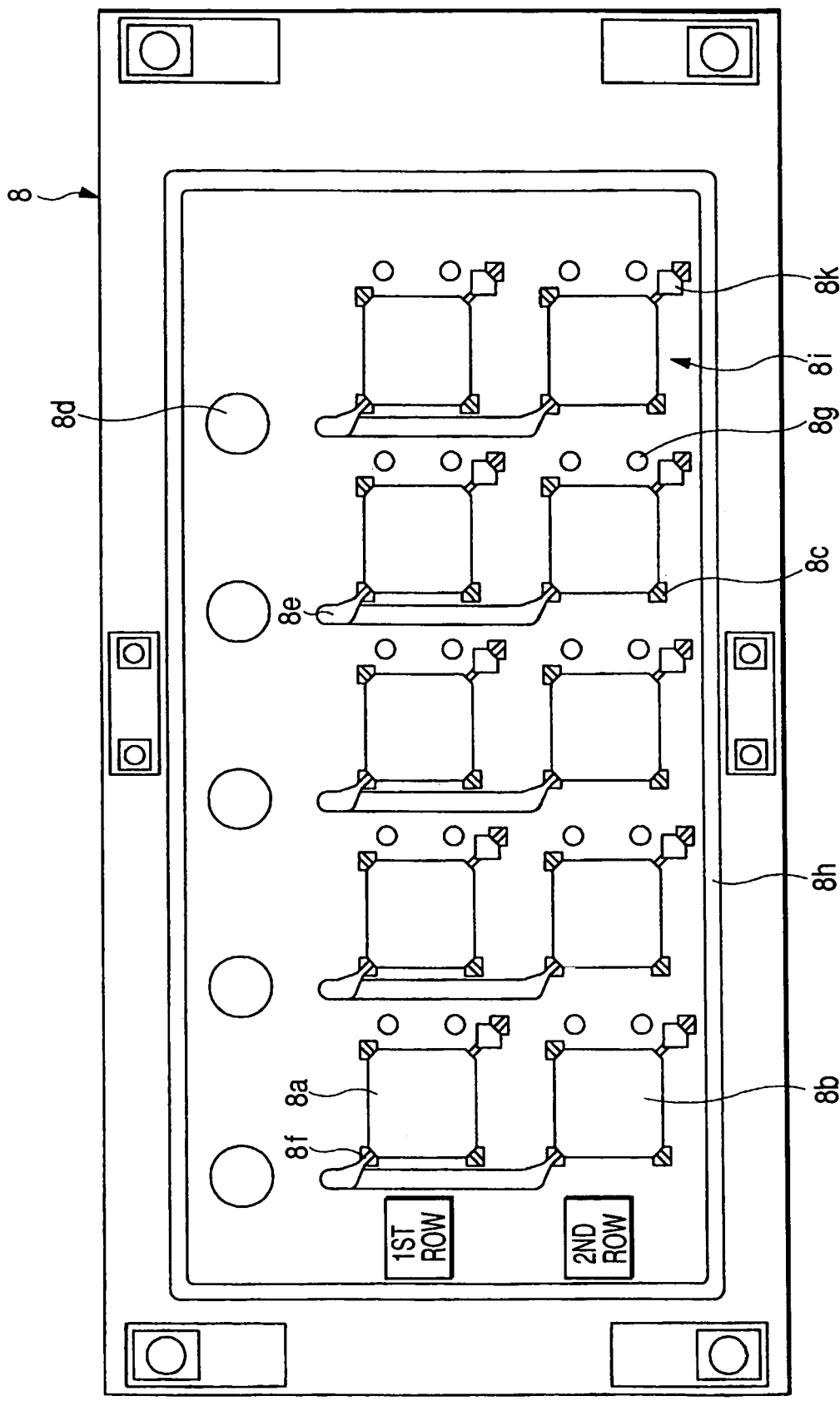
FIG. 15 is a diagrammatic plan view showing the structure of a lower mold according to a modification of the molding die used in the first embodiment.

Reference is now made to the case where the molding die 6 is additionally provided with flow cavities (auxiliary recesses) 7f and 8k located respectively in an upper mold 7 and a lower mold 8, according to the modifications illustrated in FIGS. 14 and 15. The flow cavities 7f and 8k are auxiliary recesses for retaining therein the air 9 extruded from the cavities, and they are each formed, for example, in a corner portion remote from the gate 8f in each cavity so as to be in communication with the cavity.

Figure 13:
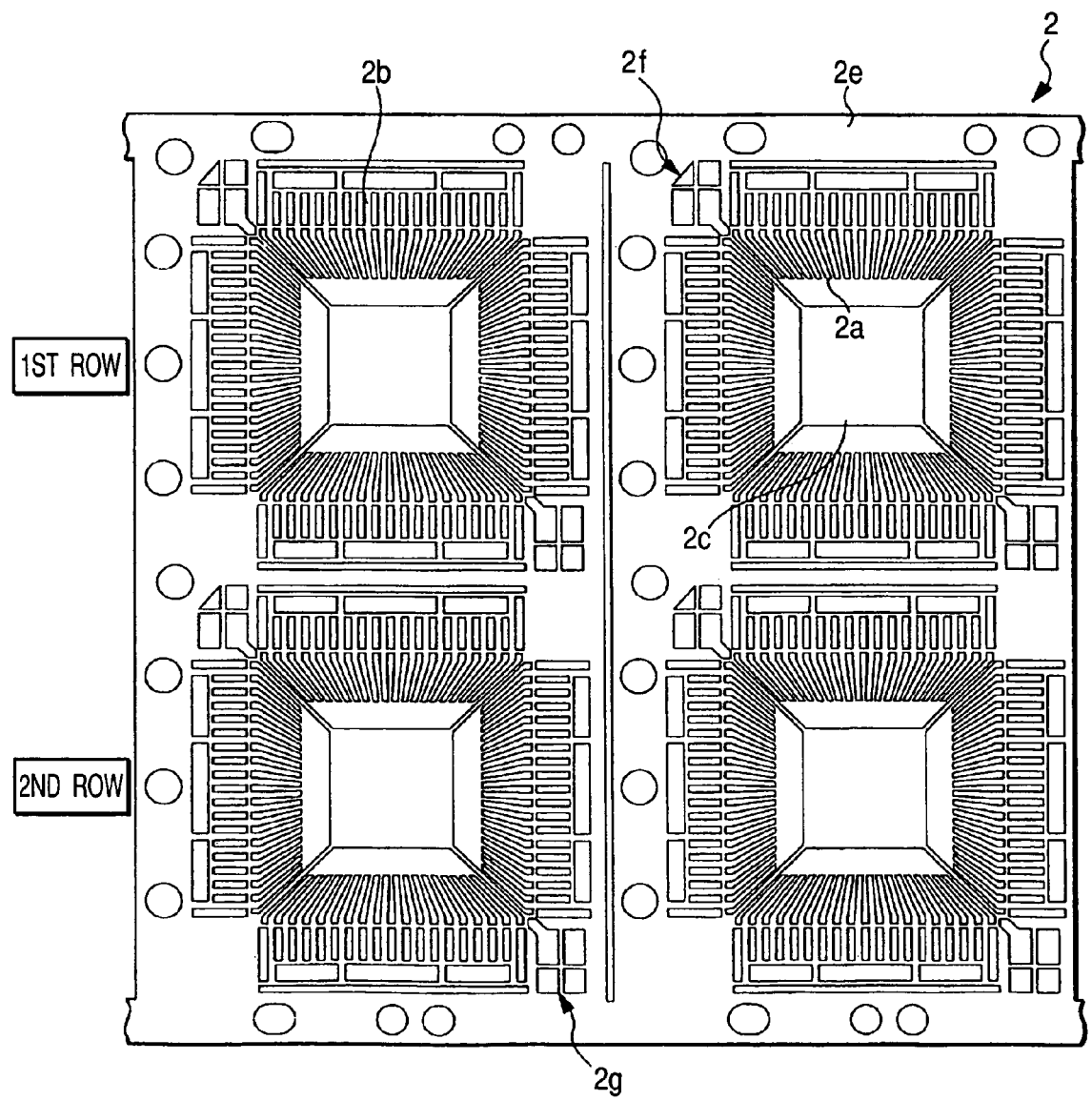
FIG. 13 is a partial plan view showing the structure of a matrix frame according to a modification of the first embodiment.

In the case of the upper mold 7 and lower mold 8 shown in FIGS. 6 and 7, respectively, the flow cavities 7f and 8k are not provided, so that, at the time of charging the sealing resin into each cavity, the air 9 present in the cavity is allowed to escape from only the air vents 7c and 8c that are in communication with the cavity. In contrast, the upper mold 7 and the lower mold 8 shown in FIGS. 14 and 15 are provided with flow cavities 7f and 8k, respectively, so that in the matrix frame 2 used for the molding die 6 in question, as shown in FIG. 13, there are flow cavity resin sump portions 2g at positions corresponding to the flow cavities 7f and 8k.

Thus, the upper mold 7 and the lower mold 8 shown in FIGS. 6 and 7 are not provided with the flow cavities 7f and 8k, respectively, and, therefore, resin sump portions corresponding to the flow cavities 7f and 8k are not formed in the matrix frame 2 shown in FIG. 5, that is used as a frame for the molding die 6 in question.

By adopting an upper mold 7 and lower mold 8 in the molding die 6, such as shown in FIGS. 6 and 7, which are not provided with flow cavities 7f and 8k, it is possible to save the amount of the sealing resin 10 being used in an amount corresponding to the resin buried in the flow cavities 7f and 8k, so that in comparison with the case of using the molding die 6 provided with flow cavities 7f and 8k, it is possible to attain resin-saving, and, hence, it is possible to reduce the manufacturing cost of the QFP 1.

Besides, since a flow cavity resin portion is not formed on the seal member 3, the cutting of the flow cavity resin portion is not needed, and, therefore, it is possible to supply the cutting step.

Moreover, in the molding die 6 that is not provided with flow cavities 7f and 8k, it is possible to form a resin flow passage easily, so that the molding die 6 can be easily formed in a desired shape, and so it is possible to reduce the manufacturing cost of the molding die 6.

Further, in the molding die 6 that is not provided with flow cavities 7f and 8k, it is possible to use a matrix frame 2 that is not formed with flow cavity resin sump portions 2g, and, hence, it is possible to employ the lead frame in common and, thereby, decrease the number of lead frame types.

On the other hand, in the case of using a molding die 6 provided with flow cavities 7f and 8k, it is possible to let the air 9 that is present in each cavity remain in the flow cavities 7f and 8k, so that a sufficient amount of air 9 can be allowed to escape from the interior of each cavity, whereby the formation of voids can be prevented in a more positive manner.

Figure 16:
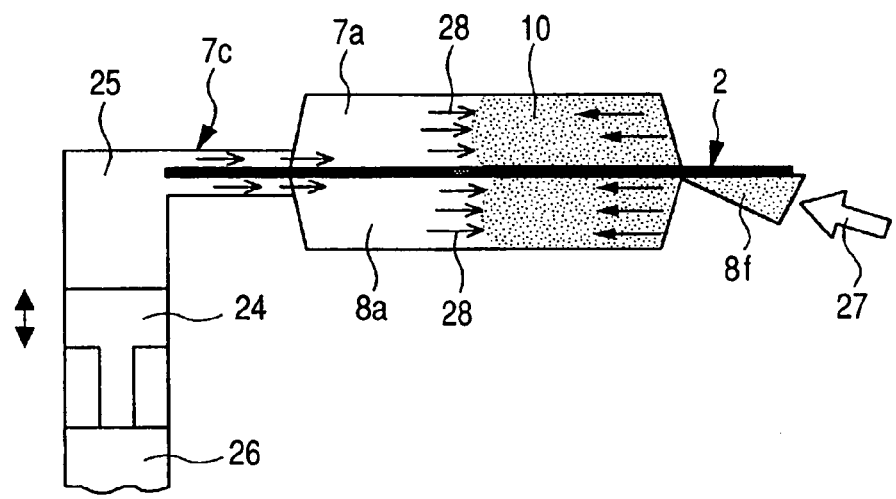
FIG. 16 is a diagrammatic partial sectional view showing a back pressure adjusting method according to a modification in the molding step adopted in the first embodiment.
Figure 17:
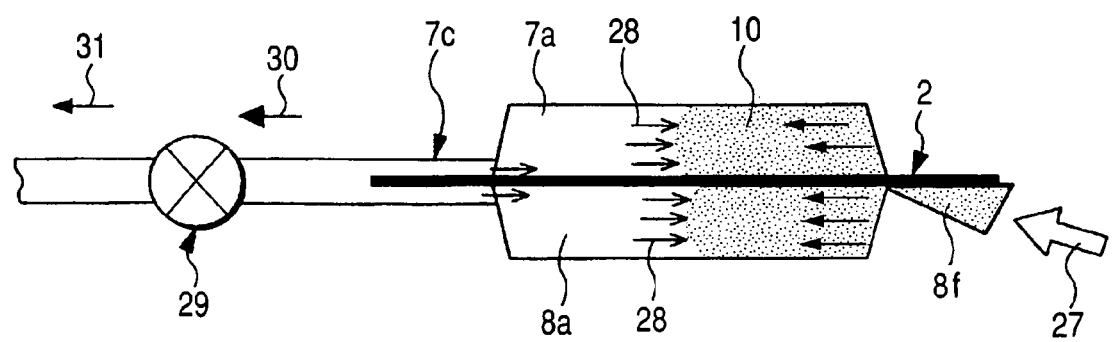
FIG. 17 is a diagrammatic partial sectional view showing a back pressure adjusting method according to a modification in the molding step adopted in the first embodiment.

FIGS. 16 and 17 show modifications of the method for adjusting the back pressure in each cavity by means different from the back pressure supply system 23 illustrated in FIG. 4.

In FIG. 16, a piston 24 is operated by a drive source, such as a motor or air pressure, causing the volume of an air tank 25 to vary and, thereby, adjusting the back pressure 28 which acts as a flow resistance against the flow of the sealing resin 10 in each cavity. That is, the air in each cavity, which is discharged under the resin injection pressure 27, is compressed into the air tank 25, thereby affording the back pressure 28.

On the other hand, in FIG. 17, the amount of air being discharged is throttled of a valve member 29 to adjust the back pressure 28 in each cavity. According to the illustrated method, the amount of air to be discharged, as indicated at 30, is adjusted so as to become larger than the actual amount of air being discharged, as indicated at 31, thereby changing the magnitude of the back pressure 28. In this modification, the valve member 29 is provided in each of the air vents 7c, 8c to throttle the intra-cavity air discharged under the resin injection pressure 27, thereby affording the back pressure 28.

Also, by the methods for adjusting the back pressure 28 according to the modifications shown in FIGS. 16 and 17, it is possible to adjust the back pressure 28 in each cavity, and the same effects can be obtained as were obtained in the use of the back pressure supply system shown in FIG. 4.

(Second Embodiment)

Figure 18:
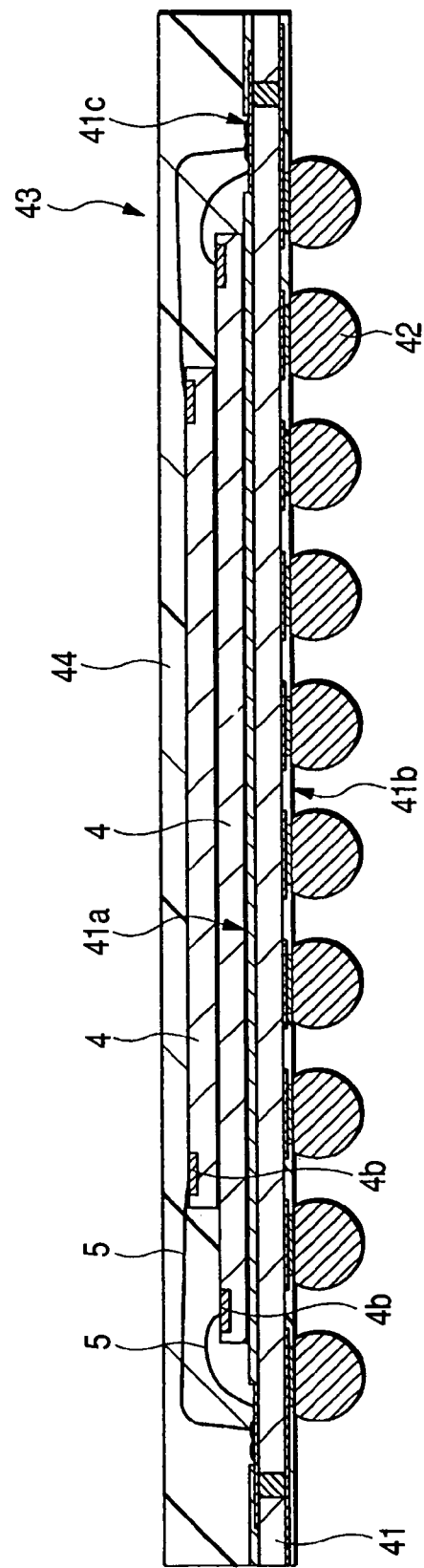
FIG. 18 is a sectional view showing a structural example of a semiconductor integrated circuit device assembled by a semiconductor integrated circuit device fabricating method according to a second embodiment of the present invention.
Figure 19:
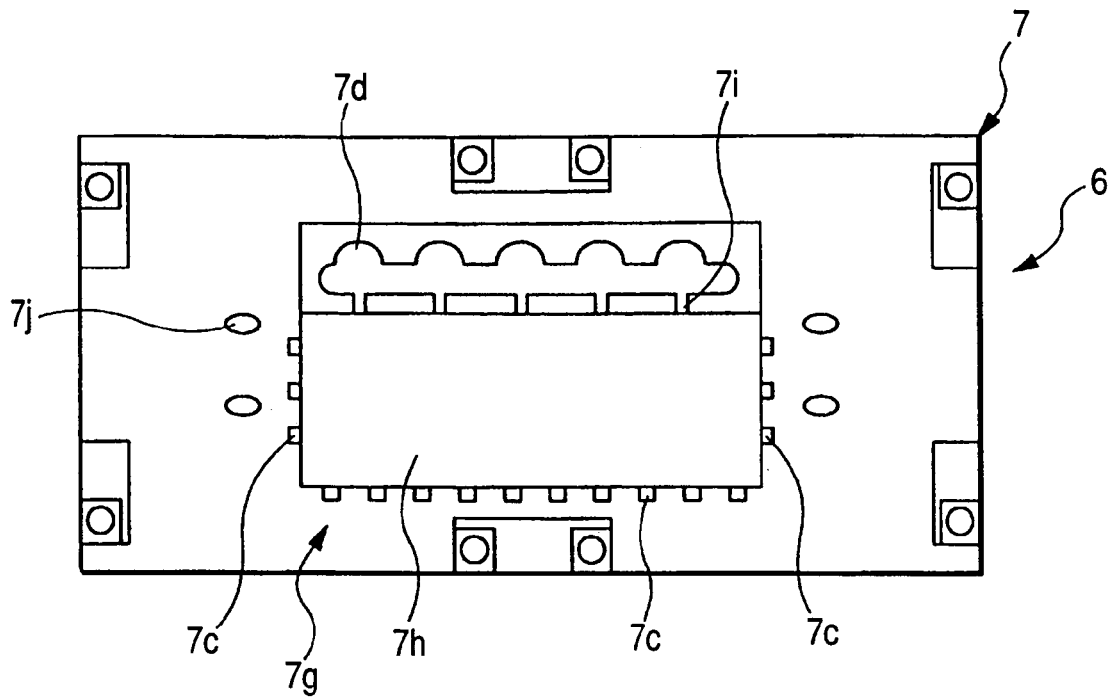
FIG. 19 is a diagrammatic plan view showing a structural example of an upper mold in a molding die used in the semiconductor integrated circuit device fabricating method of the second embodiment.
Figure 20:
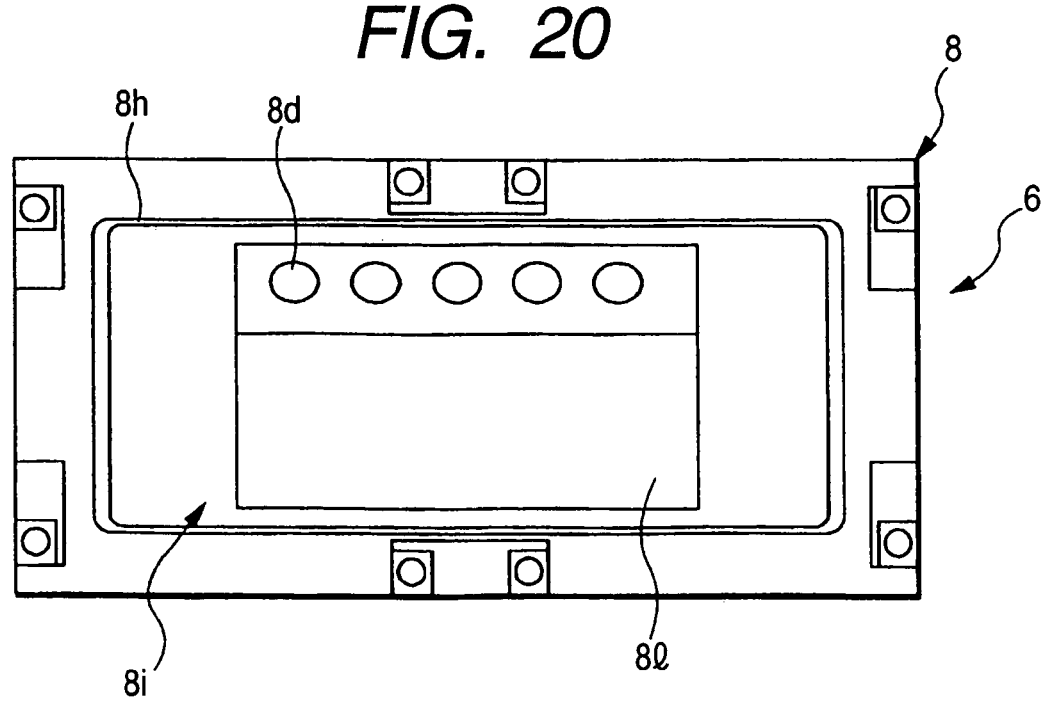
FIG. 20 is a diagrammatic plan view showing a structural example of a lower mold in the molding die used in the semiconductor integrated circuit device fabricating method of the second embodiment.
Figure 21:
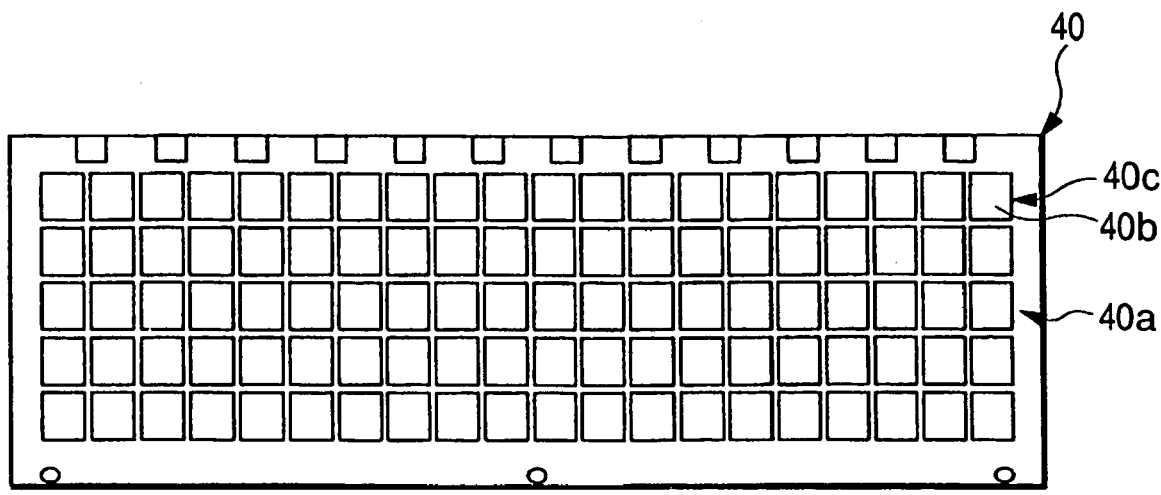
FIG. 21 is a diagrammatic plan view showing a structural example of a multi-chip substrate used in the semiconductor integrated circuit device fabricating method of the second embodiment.
Figure 22:
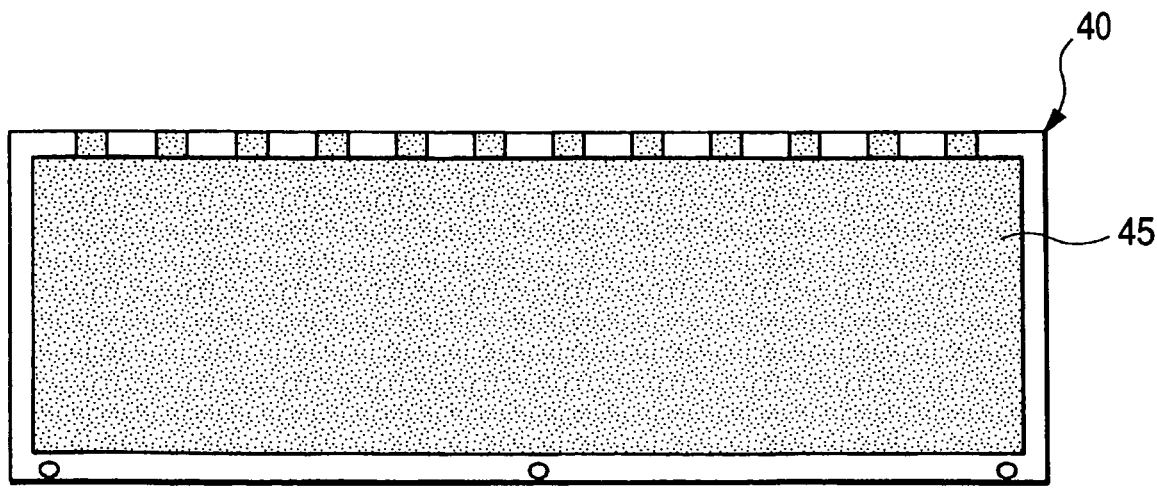
FIG. 22 is a diagrammatic plan view showing a structural example after resin molding in the semiconductor integrated circuit device fabricating method of the second embodiment.
Figure 23:
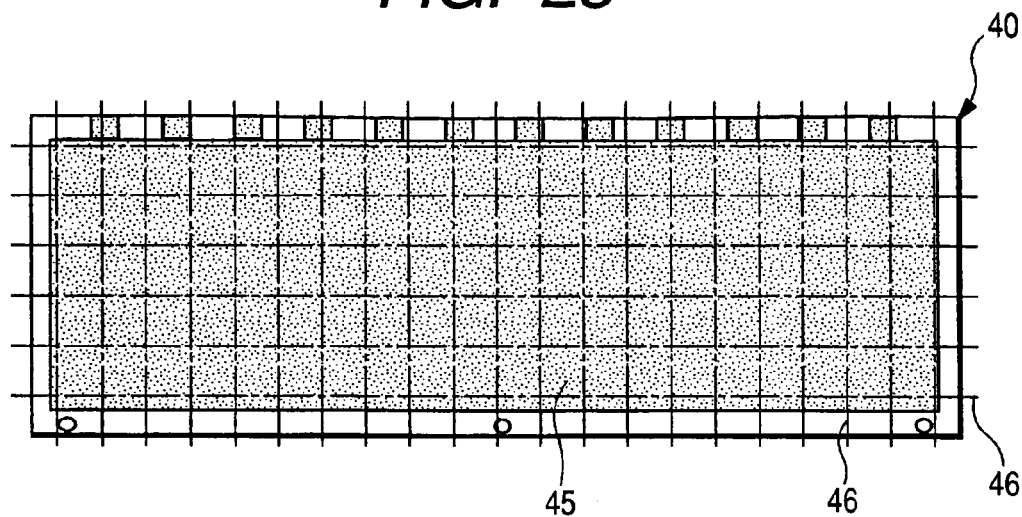
FIG. 23 is a diagrammatic plan view showing an example of a dicing line used in dividing the multi-chip substrate into individual chips after resin molding in the semiconductor integrated circuit device fabricating method of the second embodiment.
Figure 24:
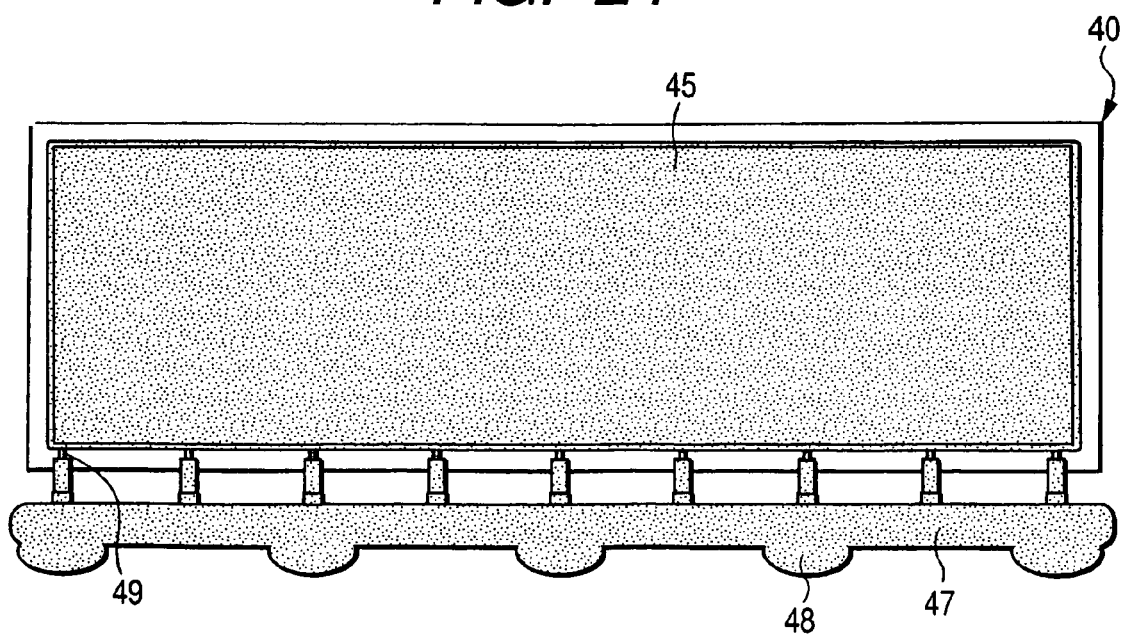
FIG. 24 is a diagrammatic plan view showing a structural example of runner and culls after resin molding in the semiconductor integrated circuit device fabricating method of the second embodiment.
Figure 25:
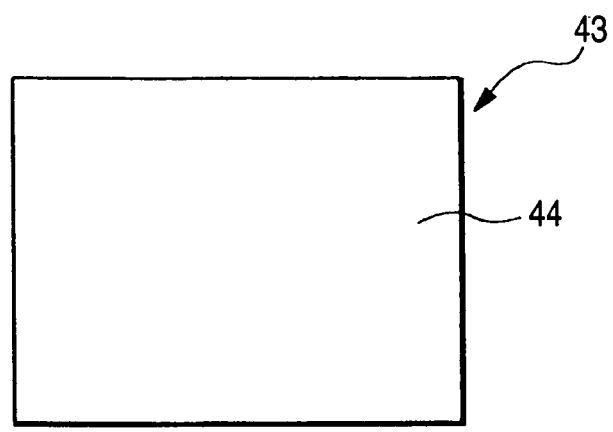
FIG. 25 is a diagrammatic top plan view showing a structural example after the division into individual chips in the semiconductor integrated circuit device fabricating method of the second embodiment.
Figure 26:
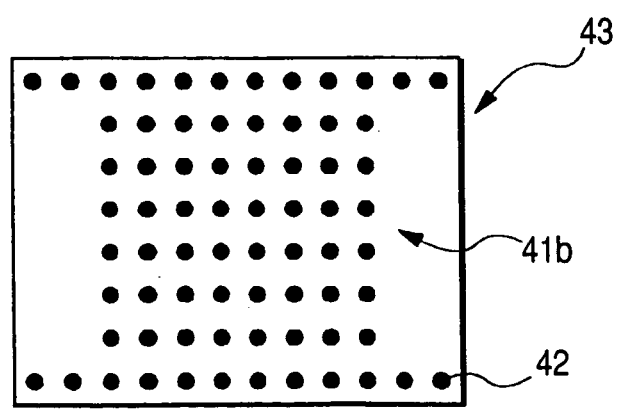
FIG. 26 is a diagrammatic bottom view showing a structural example after the division into individual chips in the semiconductor integrated circuit device fabricating method of the second embodiment.
Figure 27:
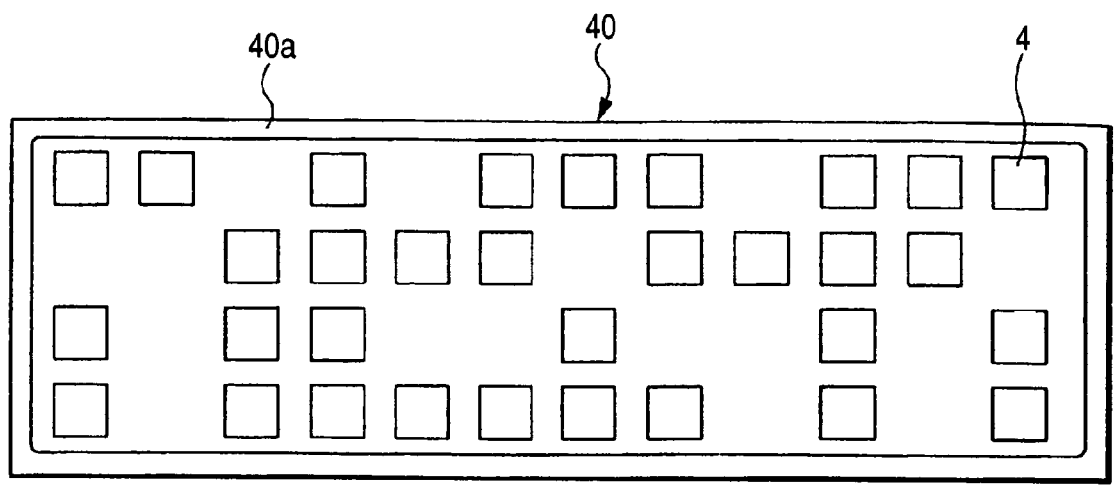
FIG. 27 is a diagrammatic plan view showing a structural example of a multi-chip substrate after the mounting of chips thereon in the semiconductor integrated circuit device fabricating method of the second embodiment.
Figure 28:
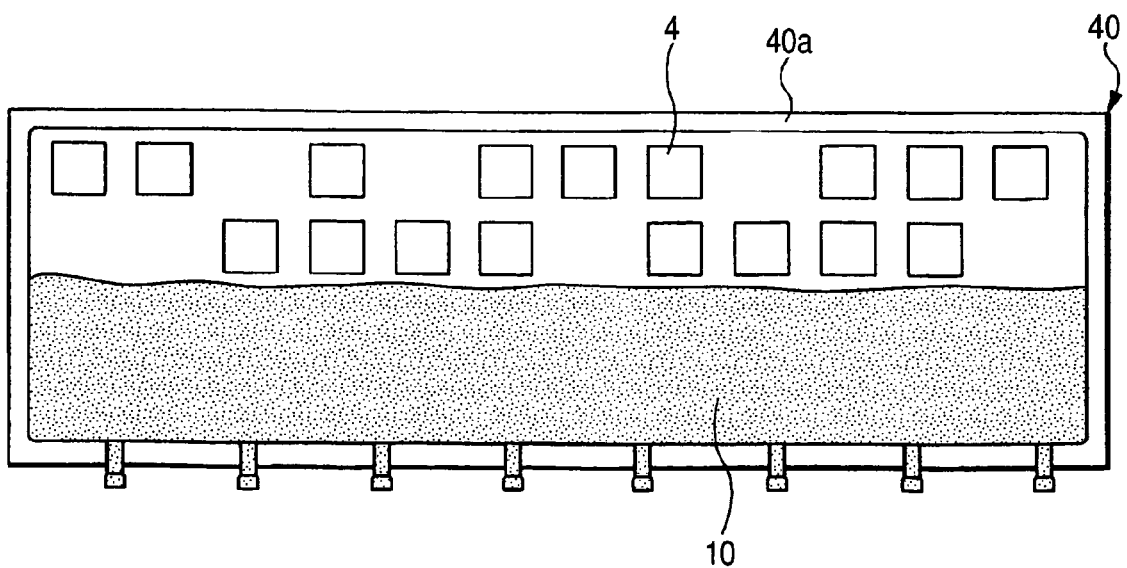
FIG. 28 is a diagrammatic plan view showing an example of a resin filled state of the multi-chip substrate illustrated in FIG. 27.

FIG. 18 is a sectional view showing a structural example of a semiconductor integrated circuit device that has been assembled by a semiconductor integrated circuit device fabricating method according to a second embodiment of the present invention; FIG. 19 is a plan view showing a structural example of an upper mold in a molding die used in the semiconductor integrated circuit device fabricating method of the second embodiment; FIG. 20 is a plan view showing a structural example of a lower mold in the molding die used in the semiconductor integrated circuit device fabricating method of the second embodiment; FIG. 21 is a plan view showing a structural example of a multi-chip substrate used in the semiconductor integrated circuit device fabricating method of the second embodiment; FIG. 22 is a plan view showing a structural example after resin molding in the semiconductor integrated circuit device fabricating method of the second embodiment; FIG. 23 is a plan view showing an example of a dicing line used in dividing the multi-chip substrate into individual chips after resin molding in the semiconductor integrated circuit device fabricating method of the second embodiment; FIG. 24 is a plan view showing a structural example of runner and culls, after resin molding, in the semiconductor integrated circuit device fabricating method of the second embodiment; FIG. 25 is a plan view showing a structural example, after the division into individual chips, in the semiconductor integrated circuit device fabricating method of the second embodiment; FIG. 26 is a bottom view showing a structural example, after the division into individual chips, in the semiconductor integrated circuit device of the second embodiment; FIG. 27 is a plan view showing a structural example of a multi-chip substrate, after the mounting of chips thereon, in the semiconductor integrated circuit device fabricating method of the second embodiment; and FIG. 28 is a plan view showing an example of a resin filled state of the multi-chip substrate illustrated in FIG. 27.

This second embodiment is directed to a method of fabricating a CSP (chip size package) 43, which is assembled using a multi-chip substrate 40.

The CSP 43 shown in FIG. 18 is a thin semiconductor package of a chip laminate type, and it comprises: a wiring substrate 41, the wiring substrate 41 having a main surface 41a and a back side 41b, with a chip mounting region 40b, as shown in FIG. 21, and plural leads 41c serving as wiring lines being formed on the main surface 41a; two semiconductor chips 4 vertically stacked in the chip mounting region 40b on the main surface 41a of the wiring substrate 41; plural wires 5 for connecting bonding electrodes 4b on each semiconductor chip 4 with corresponding leads 41c; a seal member 44, which seals the two semiconductor chips 4 and plural wires 5 with resin; and plural solder balls 42 serving as external terminals provided on the back side 41b of the wiring substrate 41.

The CSP 43 is a thin type package. The thickness of one semiconductor chip 4 is 220 µm or so, for example. In the CSP 43, the thickness from the back side 41b of the wiring substrate 41 up to the surface of the seal member 44 is 1 mm or less, for example.

The CSP 43 is formed in the following manner. As seen in FIG. 21, there is a multi-chip substrate 40 having a main surface 40a, on which plural device regions (device forming regions) 40c, each having chip mounting region 40b, are formed in a matrix arrangement. In a resin molding step after wire bonding, the plural device regions 40c, that are arranged in a matrix form, are covered with a single cavity of a molding die 6 and are sealed, followed by block molding with resin (such a resin sealing method will hereinafter be referred to as "block molding"), and the substrate is subsequently diced into individual chips.

Next, a description will be given of the structure of an upper mold 7, as shown in FIG. 19, and a lower mold 8, as shown in FIG. 20, which are used in the resin molding step in the semiconductor integrated circuit device fabricating method of this second embodiment.

In the upper mold 7 shown in FIG. 19, there is a block molding cavity 7h which can cover the main surface 40a of the multi-chip substrate 40. Around the block molding cavity 7h, there are plural air vents 7c, plural culls 7d, plural gates 7i, and plural suction holes 7j for back pressure and pressure reduction. The plural air vents 7c are provided around three sides of the block molding cavity 7h, which is quadrangular in shape, but they are not provided one side located close to the culls 7d. Further, the plural suction holes 7j are formed near the air vents 7c. Therefore, the supplying and exhausting of the air 9 at the time of application and reduction of pressure in the block molding cavity 7h can be performed in three directions in the cavity.

In the lower mold 8, as shown in FIG. 20, there are one block molding cavity 8l and plural pots 8d. Further, a ring-like packing 8h is buried outside the block molding cavity 8l and the plural pots 8d. When the upper and lower molds 7, 8 are closed to effect mold clamping, a hermetically sealed region capable of vacuum exhaust is formed by the packing,8h.

Also, in the case of the molding die 6 used in this second embodiment, as is the case with the molding die 6 used in the first embodiment, a back pressure supply system 23, such as shown in FIG. 4, is connected to the molding die. At the time of resin molding, therefore, the interiors of the block molding cavities 7h and 8l can be pressurized or pressure-reduced by the supplying or exhausting of air 9 to or from the cavities 7h and 8l from the air vents 7c through the suction holes 7j.

Next, a description will be given as to how to fabricate the semiconductor integrated circuit device (CSP 43) of this second embodiment.

First, a multi-chip substrate 40, as shown in FIG. 21, is formed so as to have plural device regions 40c, each having a chip mounting region 40b and plural leads (wiring lines) 41c, formed in a matrix arrangement.

Thereafter, semiconductor chips 4 are mounted respectively through a die bonding material or the like onto the chip mounting regions 40b in the device regions 40c of the main surface 40a of the multi-chip substrate 40. The CSP 43 of this second embodiment is a chip laminate type package. Here, the lower semiconductor chips 4 are first mounted, respectively, onto the chip mounting regions 40b in the device regions 40c, and, subsequently, the upper semiconductor chips 4 are mounted onto the lower semiconductor chips 4.

In this case, since it is an objective for the CSP 43 to attain a reduced of thickness, it is preferable that the thickness of each semiconductor chip 4 be 220 µm or so, for example, provided no limitation is made thereto.

In assembling the CSP 43, due to a defect in a certain device region 40c in the multi-chip substrate 40, there sometimes is a case where a device region 40c that is incapable of forming the CSP 43 is included among the plural device regions 40c arranged in a matrix form. As to such a multi-chip substrate 40, a semiconductor chip 4 is not mounted in the defective device region 40c, but semiconductor chips 4 are mounted in only non-defective device regions 40c, so that, in the assembling step after the end of chip mounting, as shown in FIG. 27, the multi-chip substrate 40, in which one or more semiconductor chips 4 are missing, may flow through the subsequent step.

Thus, there can be a case where the multi-chip substrate 40, after the mounting of chips, is in a state where there are device regions 40c with semiconductor chips 4 mounted therein and also device regions 40c with semiconductor chips 4 not mounted therein. In connection with such a multi-chip substrate 40 (the multi-chip substrate 40 which is in such a state will hereinafter be referred to as a "partial chip missing multi-chip substrate 40"), after the mounting of chips in this second embodiment, reference will be made below to an assembling operation. It is to be understood, however, that the assembly of CSP 43 in this second embodiment is applicable not only to a partial chip missing multi-chip substrate 40, but also to a multi-chip substrate 40 with semiconductor chips 4 mounted in all the device regions 40c on the main surface 40a.

After the chips have been stacked, wire bonding is performed. To be more specific, bonding electrodes 4b that are formed on the lower semiconductor chip 4 and corresponding leads 41c are connected together through wires 5. Likewise, bonding electrodes 4b that are formed on the upper semiconductor chip 4 and corresponding leads 41c are connected together through wires 5. Thereafter, resin molding is performed.

Also, in the resin molding according to this second embodiment, as shown in the timing chart of FIG. 8, resin filling and the application and reduction of pressure in each cavity are performed in a timed sequence, but as to the timings of plunger operation, solenoid valve operation and exhaust valve operation, as well as the tolerances of the respective operation times, they may be just the same as in the first embodiment, or they may be changed according to various types, for example.

First, the multi-chip substrate 40, in a partial chip missing state and after wire bonding, is placed on the lower mold 8 of the molding die 6; then, the plural device regions 40c on the multi-chip substrate 40 are together covered with the single block molding cavity 7h of the upper mold 7; and the upper and lower molds 7, 8 of the molding die 6 are closed so as to clamp the substrate.

After making sure that the mold has been clamped, the plunger operation shown in FIG. 8 is started so as inject the sealing resin 10 into the block molding cavities 7h and 8l. In this case, according to this second embodiment, as shown in FIG. 28, the sealing resin 10 is charged in such a manner that the charging speeds thereof for the plural semiconductor chips 4, which are arranged in rows in a direction (longitudinal direction of the multi-chip substrate 40) orthogonal to the resin injecting direction in the block molding cavities 7h and 8l on the multi-chip substrate 40, become almost equal in the plural semiconductor chips arranged in a respective row.

More specifically, a predetermined amount of air 9 is fed from the plural air vents 7c during resin filling into the block molding cavities 7h and 8l to pressurize the interiors of the cavities, whereby a flow resistance of a nearly uniform magnitude can be imparted to the whole of the sealing resin 10 during resin filling, and the charging speeds of the sealing resin 10 for the plural semiconductor chips 4 arranged in rows in a direction orthogonal to the resin injecting direction become almost equal in the semiconductor chips arranged in a respective row, as shown in FIG. 28.

The sealing resin 10 is injected into the block molding cavities 7h and 8l at a resin injection pressure of about 490 MPa (50 kg/cm$^2$) or lower. By so doing, it is possible to prevent the occurrence of a chip cracking caused by the resin injection pressure, even in the case of a semiconductor chip 4 as thin as 220 μm or less.

After the pressurization, as in the first embodiment, the interiors of the block molding cavities 7h and 8l are pressure-reduced to prevent pressurized air from being included in the sealing resin 10, thereby preventing the formation of voids.

In the resin molding performed in this second embodiment, as in the first embodiment, the pressure in the interiors of the block molding cavities 7h and 8l are not regulated during the period after mold clamping until arrival of the sealing resin 10 at the gates 7i. Further, how to perform pressurization and pressure reduction, as well as the timing of pressurization and that of pressure reduction, are the same as in the first embodiment.

By thus pressurizing the interiors of the block molding cavities 7h and 8l during resin filling into the cavities, a predetermined flow resistance can be imparted to the whole of the sealing resin 10 during resin filling. Consequently, the charging speeds of the sealing resin 10 for plural semiconductor chips 4, that are arranged in rows in a direction orthogonal to the resin injecting direction, can be made almost equal in the plural semiconductor chips arranged in a respective row.

As a result, it is possible to eliminate the occurrence of an unfilled portion within the block molding cavities 7h and 8l, and, hence, it is possible to stabilize the quality of the product, i.e., CSP 43.

Moreover, even when the multi-chip substrate 40 is in a state of partial chip missing, since it is possible to substantially equalize the resin charging speeds among plural semiconductor chips 4 in a respective row, it is not necessary to perform the mounting of a dummy chip, which has been so far performed for the multi-chip substrate 40 which is in a state of partial chip missing. Consequently, it is possible to omit a dummy chip mounting step, and, hence, possible to simplify the fabrication process for the CSP 43. Further, CSP 43 can be fabricated at a lower cost because a dummy chip is not needed.

Resin molding is now over. The molding die 6 is opened, and, thereafter, the multi-chip substrate 40 is taken out from the molding die 6. In this case, as shown in FIG. 24, a block molding portion 45 formed by block molding is provided on a main surface 40a of the multi-chip substrate 40. Further, runner resin 47, cull resin 48, and gate resin 49 are formed on the main surface 40a.

Thereafter, the runner resin 47, cull resin 48 and gate resin 49 are removed from the block molding portion 45 to provide the state shown in FIG. 22. Further, the multi-chip substrate 40 is cut, device region 40c, by device region 40c into individual chips.

At this time, dicing is performed along a dicing line 46, as shown in FIG. 23, to dice the multi-chip substrate together with the block molding portion 45, thereby to obtain individual chips, as shown in FIG. 25.

Subsequently, as shown in FIG. 26, plural solder balls 42 are attached to the back side 41b of the wiring substrate 41 obtained by the dicing. Now the assembly of the CSP 43 is over. Mounting of the solder balls 42 also may be carried out on the multi-chip substrate 40 prior to the dicing thereof into individual chips.

In the assembly of the CSP 43 according to this second embodiment, it is possible to stabilize the product quality even in the case of a chip laminate type thin CSP 43 having a thickness of not larger than 1 mm from the back side 41b of the wiring substrate 41 up to the surface of the seal member 44.

Although the present invention has been described herein on the basis of first and second embodiments, it goes without saying that the invention is not limited to those embodiments, but that various changes may be made within a scope not departing from the gist of the invention.

For example, although the semiconductor integrated circuit device in the first embodiment is a QFP, it may be any other semiconductor integrated circuit device than a QFP insofar as the device adopted is a thin type device formed by using the matrix frame 2.

Although, in the first embodiment, the number of cavity rows in the molding die 6 is two, the invention is not limited to two cavity rows, but any other plural number of rows may be adopted, so long as it is not less than two.

Further, although the CSP 43 in the second embodiment is a chip laminate type CSP, the invention is not limited thereto, but it may carry only one semiconductor chip 4.

The following is a brief description of an effect obtained by typical features of the present invention.

By pressurizing the interiors of cavities arranged in a matrix form and charging a sealing resin into the pressurized cavities, it is possible to equalize the resin charging speeds for all of the cavities, and, hence, it is possible to stabilize the product quality.

The invention claimed is:

1. A method of fabricating a semiconductor integrated circuit device, comprising the steps of:
   (a) providing a substrate over which a plurality of device forming regions are arranged in a matrix form corresponding to individual device forming regions, the device forming regions each having a chip mounting region and a plurality of leads;
   (b) mounting semiconductor chips respectively onto the chip mounting regions of the substrate;
   (c) introducing the substrates, with the mounted semiconductor chips, between a pair of molding dies so as to accommodate the device forming regions within a molding cavity formed with the molding dies;
   (d) pressurizing an interior of the cavity while charging of a sealing resin into the cavity; and
   (e) after step (d), dividing the substrate into the individual device forming regions.

2. A method according to claim 1, wherein the semiconductor chips are stacked over the device forming regions of the substrate.

3. A method according to claim 2, wherein a thickness from a back side of the substrate of the semiconductor integrated circuit device up to a top surface of a seal member after step (e) is not larger than 1 mm.

4. A method according to claim 1, wherein, in step (d), the sealing resin is injected into the cavity at a resin injection pressure of not higher than 490 MPa.

5. A method according to claim 1, wherein the interior of the cavity is maintained in a state of atmospheric pressure until the sealing resin reaches gates formed with the molding dies.

6. A method according to claim 1, wherein the pressurization of the interior of the cavity is started substantially simultaneously with the start of entry of the sealing resin into the cavity.

* * * * *